(12) United States Patent
Wu et al.

(10) Patent No.: US 9,673,204 B2
(45) Date of Patent: Jun. 6, 2017

(54) SEMICONDUCTOR DEVICE STRUCTURE AND METHOD FOR FORMING THE SAME

(71) Applicant: TAIWAN SEMICONDUCTOR MANUFACTURING CO., LTD., Hsin-Chu (TW)

(72) Inventors: Chang-Ming Wu, New Taipei (TW); Tsung-Hsueh Yang, Taichung (TW); Chung-Chiang Min, Zhubei (TW); Shih-Chang Liu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/584,735

(22) Filed: Dec. 29, 2014

(65) Prior Publication Data

US 2016/0190268 A1   Jun. 30, 2016

(51) Int. Cl.

| | | |
|---|---|---|
| *H01L 27/115* | (2006.01) | |
| *H01L 27/11521* | (2017.01) | |
| *H01L 29/06* | (2006.01) | |
| *H01L 21/762* | (2006.01) | |
| *H01L 29/66* | (2006.01) | |
| *H01L 21/28* | (2006.01) | |
| *H01L 29/423* | (2006.01) | |
| *H01L 27/11519* | (2017.01) | |
| *H01L 29/788* | (2006.01) | |

(52) U.S. Cl.
CPC .. *H01L 27/11521* (2013.01); *H01L 21/28273* (2013.01); *H01L 21/76224* (2013.01); *H01L 27/11519* (2013.01); *H01L 29/0649* (2013.01); *H01L 29/42328* (2013.01); *H01L 29/66825* (2013.01); *H01L 29/7881* (2013.01)

(58) Field of Classification Search
CPC ............. H01L 27/115; H01L 27/11517; H01L 27/11521; H01L 21/76224; H01L 29/66825

See application file for complete search history.

(56) References Cited

U.S. PATENT DOCUMENTS

| | | | |
|---|---|---|---|
| 6,413,809 B2 * | 7/2002 | Nakamura | ............ H01L 27/115 257/E21.682 |
| 6,876,032 B2 | 4/2005 | Hsieh | |
| 7,238,575 B2 * | 7/2007 | Ding | ..................... H01L 27/115 257/E21.68 |
| 8,445,953 B2 | 5/2013 | Shen et al. | |

(Continued)

*Primary Examiner* — Jose R Diaz
(74) *Attorney, Agent, or Firm* — Birch, Stewart, Kolasch & Birch, LLP

(57) ABSTRACT

A semiconductor device structure is provided. The semiconductor device structure includes a substrate. The semiconductor device structure also includes a first isolation structure partially embedded in the substrate. The first isolation structure has a first upper surface with a first recess. The semiconductor device structure further includes a second isolation structure partially embedded in the substrate. In addition, the semiconductor device structure includes a first gate over the substrate and between the first isolation structure and the second isolation structure. The first gate extends onto the first upper surface to cover the first recess. The semiconductor device structure includes a second gate over the first gate.

20 Claims, 28 Drawing Sheets

(56) References Cited

U.S. PATENT DOCUMENTS

2005/0196913 A1\* 9/2005 Hsiao .................... H01L 27/115
438/201
2011/0133266 A1\* 6/2011 Tang ................. H01L 21/28273
257/316

\* cited by examiner

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs with each generation having smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
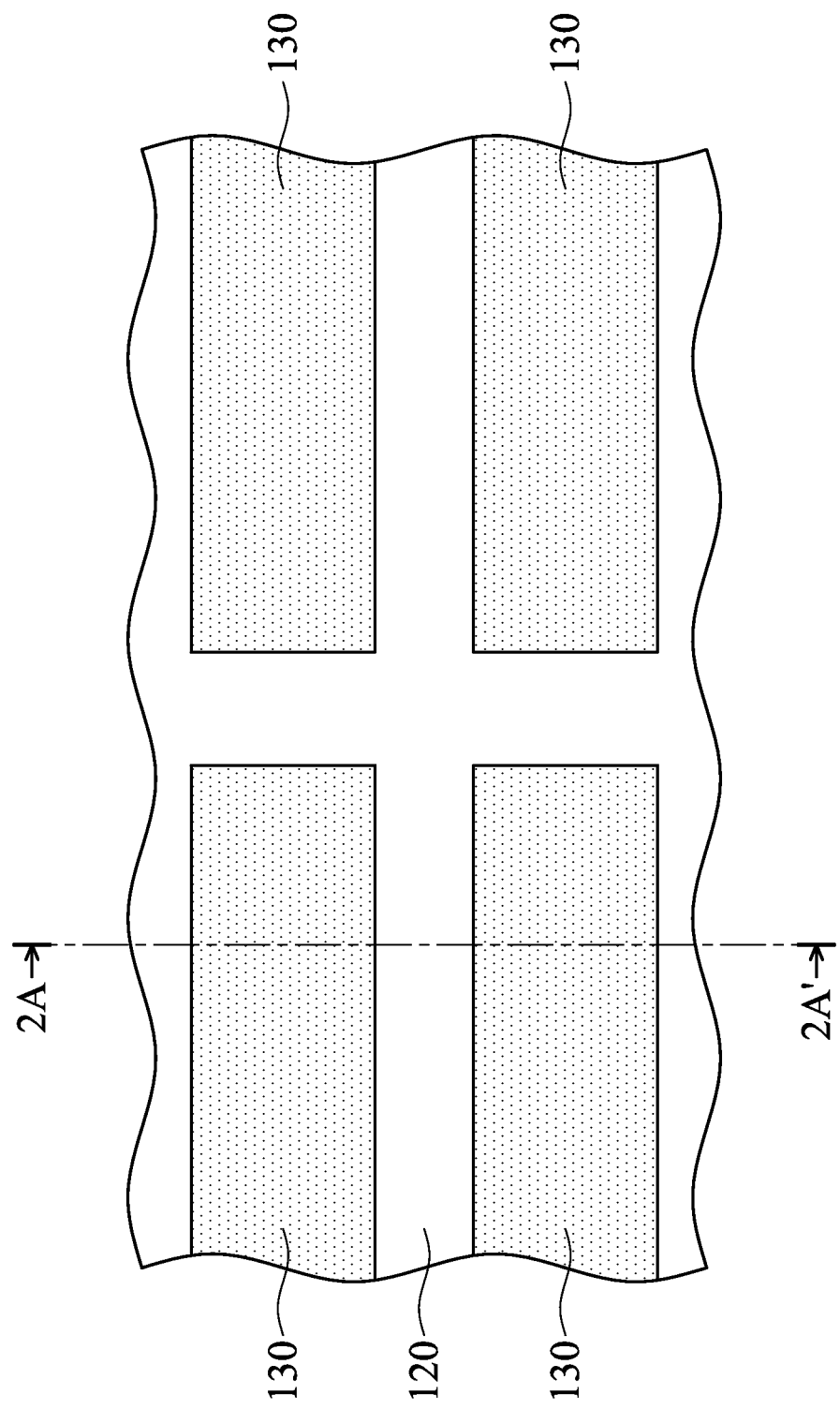
FIG. 1 is a top view of a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 2A:
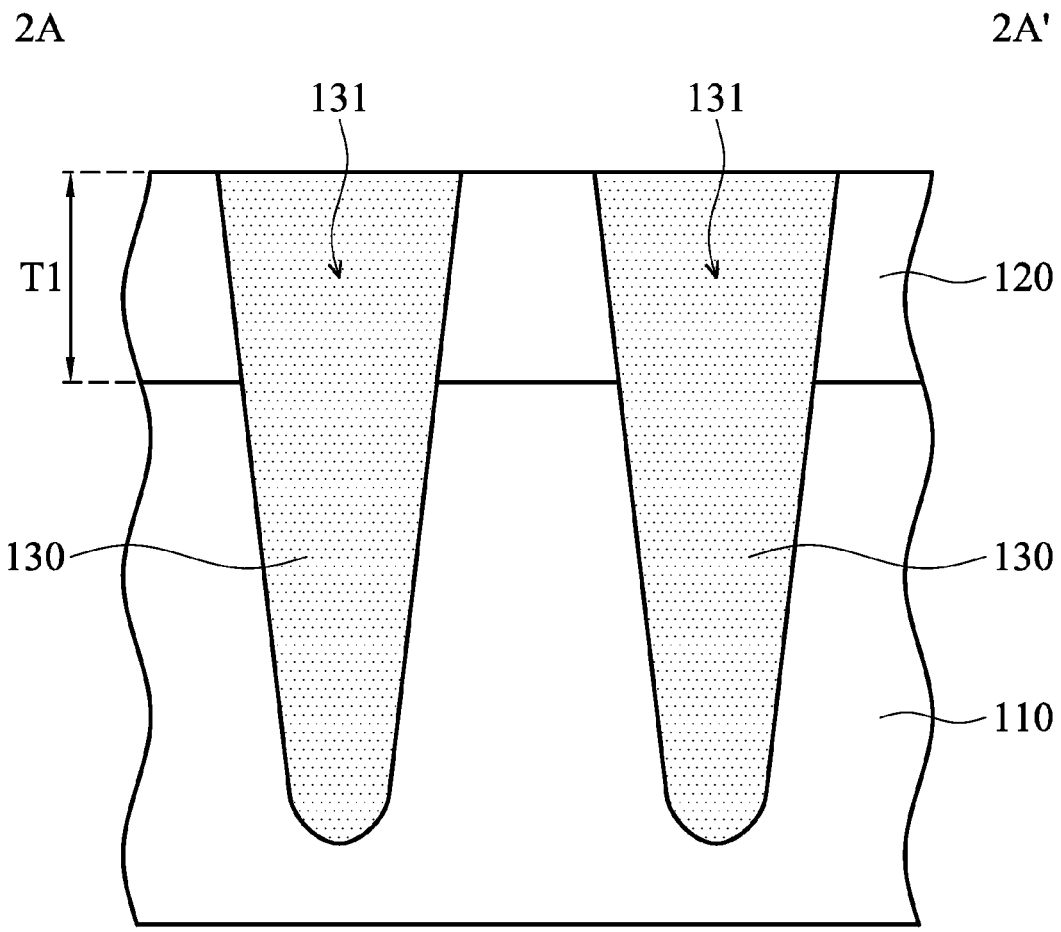
FIGS. 2A-2J are cross-sectional views of various stages of a process for forming a semiconductor device structure, in accordance with some embodiments.

FIG. 1 is a top view of a semiconductor device structure, in accordance with some embodiments. FIG. 2A is a cross-sectional view illustrating the semiconductor device structure along sectional line 2A-2A' in FIG. 1, in accordance with some embodiments. FIGS. 2A-2J are cross-sectional views of various stages of a process for forming a semiconductor device structure, in accordance with some embodiments.

As shown in FIGS. 1 and 2A, a substrate 110 is provided, in accordance with some embodiments. The substrate 110 is a semiconductor substrate, in accordance with some embodiments. The substrate 110 includes a semiconductor wafer (such as a silicon wafer) or a portion of a semiconductor wafer, in accordance with some embodiments.

In some embodiments, the substrate 110 is made of an elementary semiconductor material including silicon or germanium in a single crystal, polycrystal, or amorphous structure. In some other embodiments, the substrate 110 is made of a compound semiconductor such as silicon carbide, gallium arsenide, gallium phosphide, indium phosphide, indium arsenide, an alloy semiconductor such as SiGe, or GaAsP, or a combination thereof. In some embodiments, the substrate 110 includes multi-layer semiconductors, semiconductor-on-insulator (SOI) (such as silicon-on-insulator or germanium-on-insulator), or a combination thereof.

As shown in FIGS. 1 and 2A, a mask layer 120 is formed over the substrate 110, in accordance with some embodiments. In some embodiments, the mask layer 120 includes nitride, such as silicon nitride, silicon oxynitride, or the like. The mask layer 120 is formed by a depositing process (such as a chemical vapor deposition process), in accordance with some embodiments.

As shown in FIGS. 1 and 2A, isolation structures 130 are formed in the mask layer 120 and the substrate 110, in accordance with some embodiments. The isolation structures 130 pass through the mask layer 120 and penetrate into the substrate 110, in accordance with some embodiments. The isolation structures 130 are partially embedded in the substrate 110, in accordance with some embodiments.

The isolation structures 130 are shallow trench isolation (STI) structures, in accordance with some embodiments. The isolation structures 130 are configured to define and electrically isolate various device elements (not shown) formed in the substrate 110, in accordance with some embodiments.

Examples of the various device elements include memory cells, transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

The isolation structures 130 are made of a dielectric material, in accordance with some embodiments. The dielectric material includes silicon oxide, silicon nitride, silicon oxynitride, fluoride-doped silicate glass (FSG), a low-K dielectric material, other suitable materials, or combinations thereof, in accordance with some embodiments. The isolation structures 130 and the mask layer 120 are made of different materials, in accordance with some embodiments.

In some embodiments, the isolation structures 130 are made of oxide, and the mask layer 120 is made of nitride. The isolation structures 130 are formed by using an isolation technology, such as local oxidation of semiconductor (LOCOS), shallow trench isolation (STI), or the like, in accordance with some embodiments.

In some embodiments, the formation of the isolation structures 130 includes patterning the mask layer 120 and the substrate 110 by performing a photolithography process and an etching process over the mask layer 120 and the substrate 110 so as to form trenches 131 in the mask layer 120 and the substrate 110; filling the trenches 131 with the dielectric material; and performing a chemical mechanical polishing process to remove the dielectric material outside of the trenches 131.

The etching process for forming the trenches 131 includes a dry etching process, a wet etching process, a plasma etching process, or a combination thereof, in accordance with some embodiments. The filling of the trenches 131 includes a chemical vapor deposition process, in accordance with some embodiments.

Figure 2B:
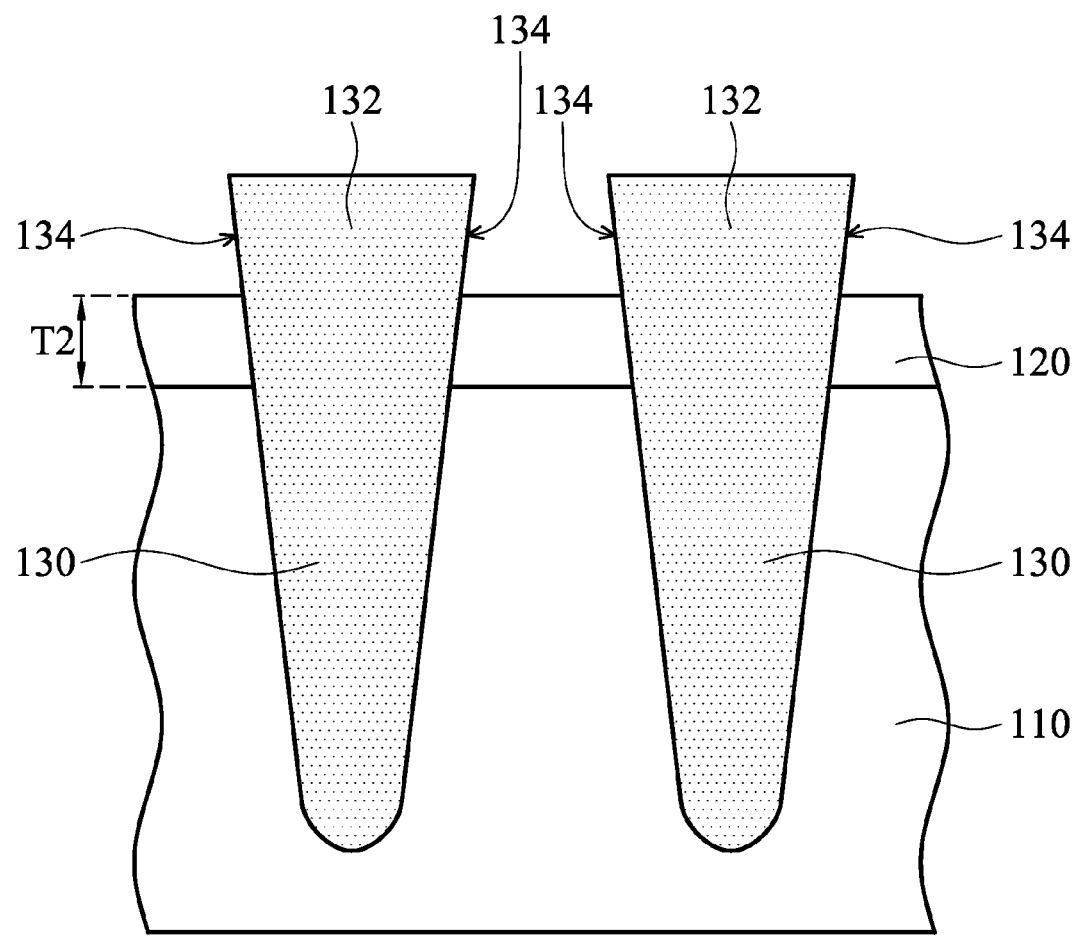

As shown in FIG. 2B, the mask layer 120 is thinned to expose a portion 132 of each of the isolation structures 130, in accordance with some embodiments. The thinned mask layer 120 partially covers sidewalls 134 of the isolation structures 130, in accordance with some embodiments. The mask layer 120 is thinned using a wet etching process, in accordance with some embodiments. In some embodiments, a ratio of a thickness T2 of the thinned mask layer 120 (as shown in FIG. 2B) to a thickness T1 of the unthinned mask layer 120 (as shown in FIG. 2A) ranges from about 0.1 to about 0.7.

Figure 2C:
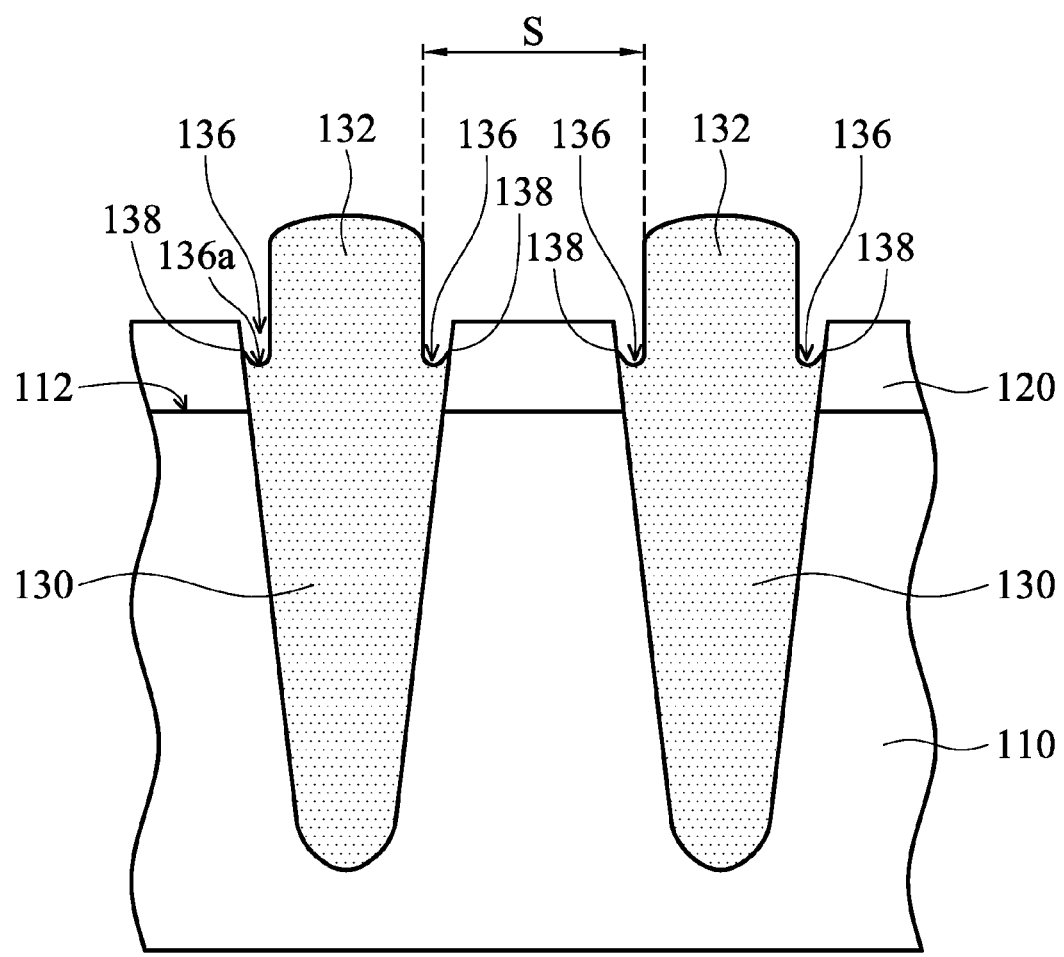

As shown in FIG. 2C, the portions 132 are partially removed to enlarge the distance S between two adjacent portions 132, in accordance with some embodiments. During the partial removal process, the isolation structures 130 that pass through and are adjacent to the mask layer 120 are partially removed as well, in accordance with some embodiments. Therefore, recesses 136 are formed in the isolation structures 130 that pass through and are adjacent to the mask layer 120, in accordance with some embodiments.

After the partial removal process, each of the isolation structures 130 has an edge 138 between the mask layer 120 and the recess 136 of the isolation structure 130, in accordance with some embodiments. The recess 136 is adjacent to the edge 138, in accordance with some embodiments. In some embodiments, the edge 138 is a protruding edge extending away from the substrate 110, in accordance with some embodiments. In some other embodiments, the edge 138 is a substantially flat edge.

In some embodiments, a bottom surface 136a of the recess 136 is above an upper surface 112 of the substrate 110. That is, the recess 136 does not extend into the substrate 110, in accordance with some embodiments. The partial removal process includes a wet etching process using the mask layer 120 as an etching mask, in accordance with some embodiments.

Figure 2D:
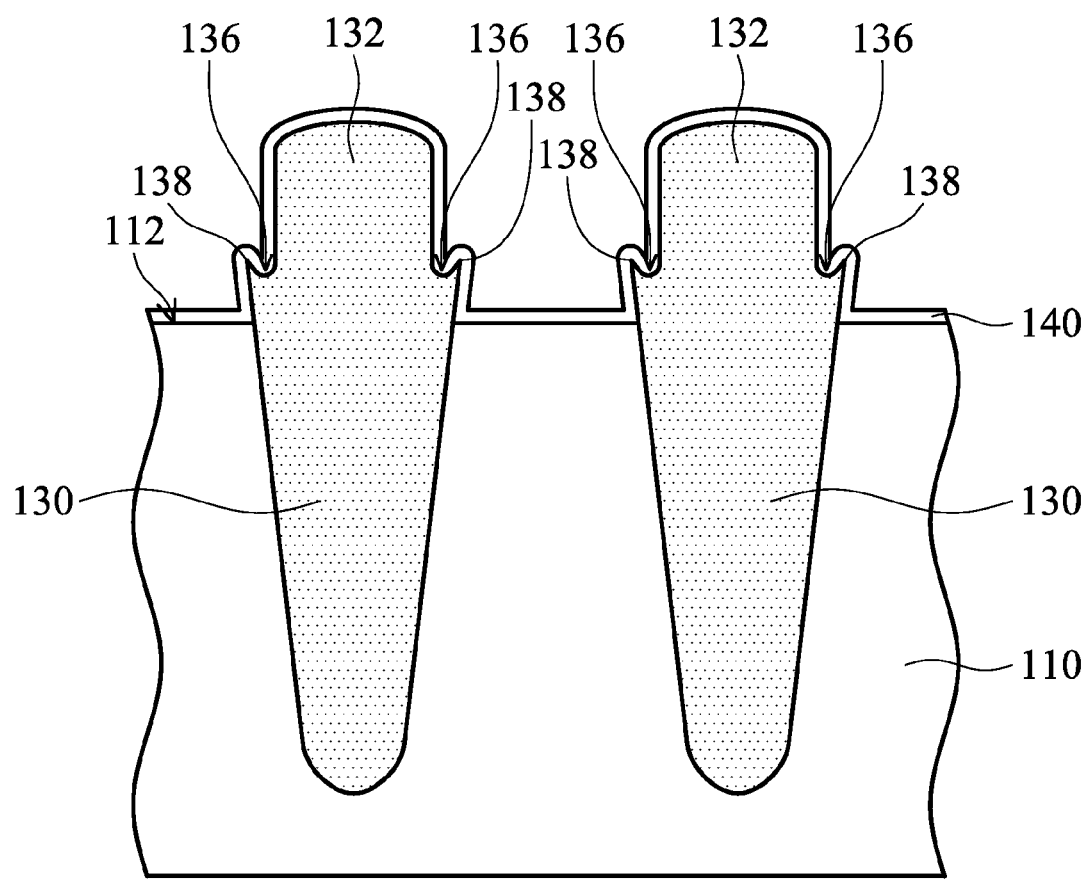

As shown in FIG. 2D, the mask layer 120 is removed, in accordance with some embodiments. The removal process includes a dry etching process or a wet etching process, in accordance with some embodiments. As shown in FIG. 2D, a gate dielectric material layer 140 is formed over the substrate 110, in accordance with some embodiments.

The gate dielectric material layer 140 covers the substrate 110 and the isolation structures 130, in accordance with some embodiments. In some embodiments, the gate dielectric material layer 140 conformally covers the upper surface 112 of the substrate 110 and the edges 138, the recesses 136, and the portions 132 of the isolation structures 130. The gate dielectric material layer 140 is formed using a chemical vapor deposition process, a physical vapor deposition process, or another suitable process.

Figure 2E:
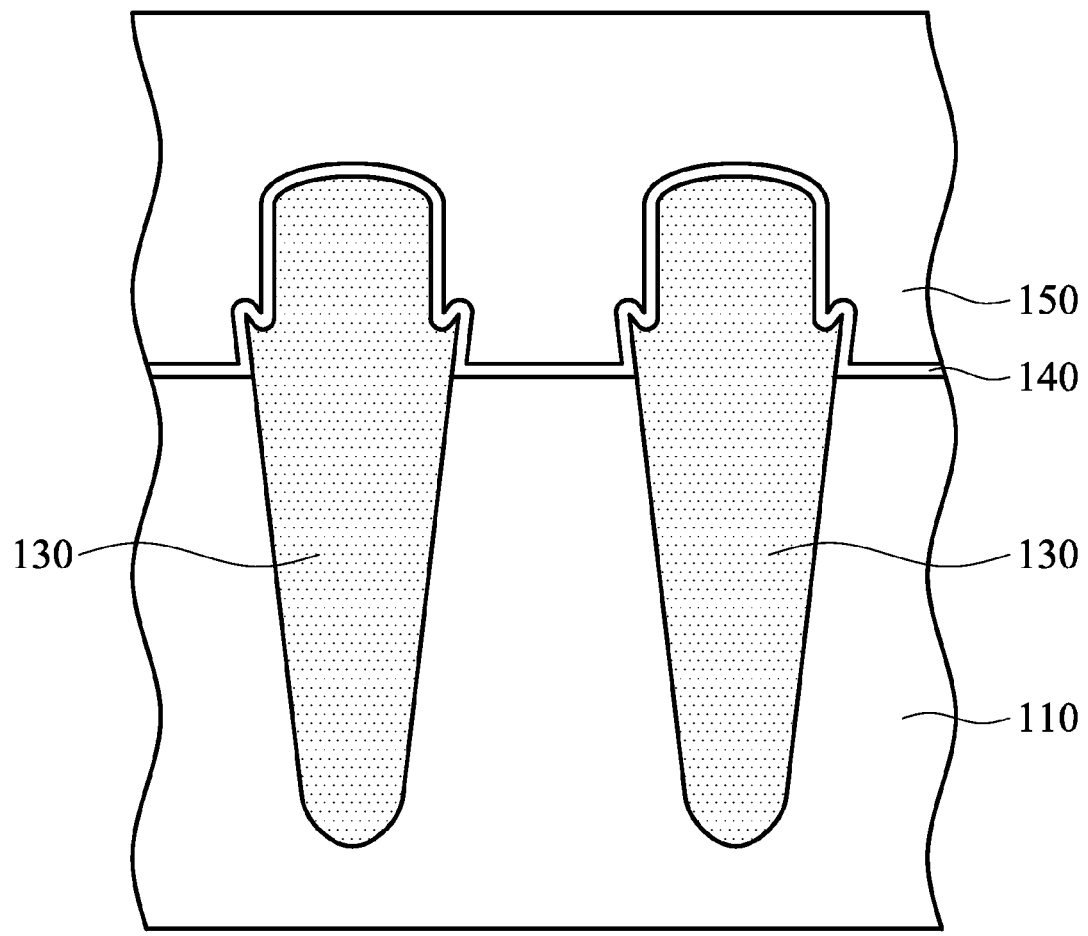

As shown in FIG. 2E, a gate material layer 150 is deposited over the substrate 110, in accordance with some embodiments. In some embodiments, the gate material layer 150 is also referred to as a floating-gate material layer. The gate material layer 150 is made of polysilicon, in accordance with some embodiments. The gate material layer 150 is deposited using a chemical vapor deposition process, in accordance with some embodiments.

Figure 2F:
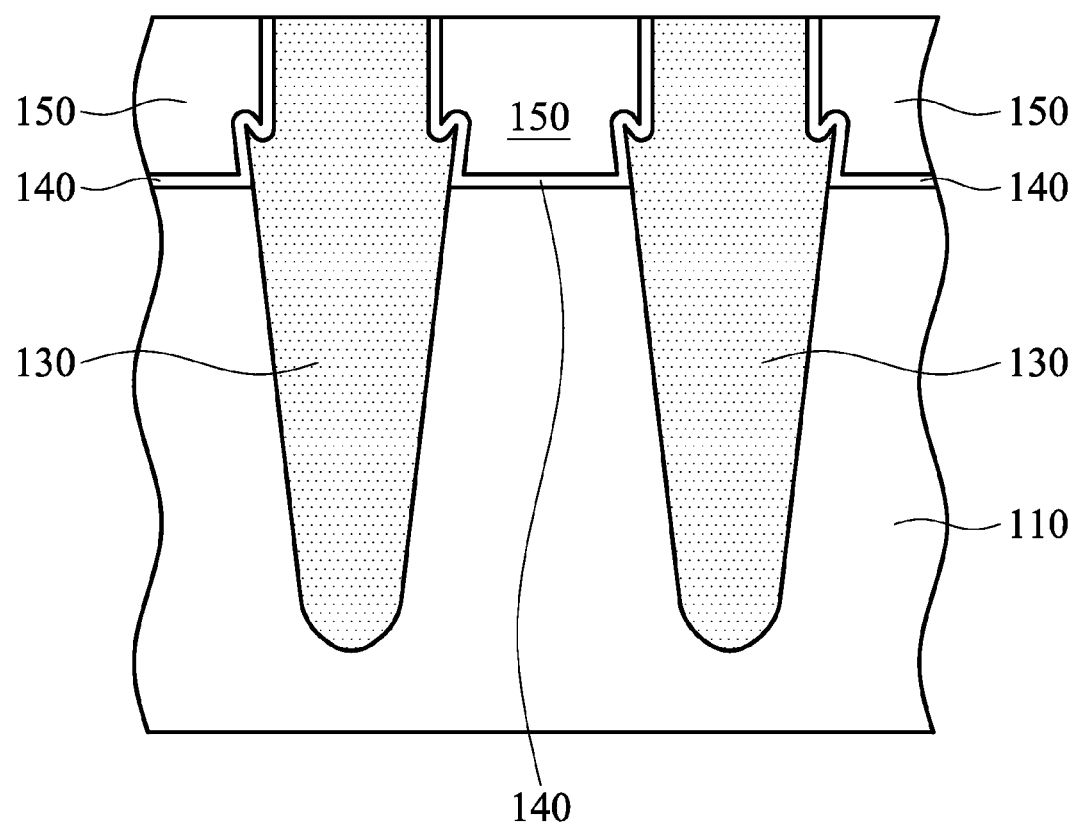

As shown in FIG. 2F, a planarization process is performed to remove portions of the gate material layer 150, the gate dielectric material layer 140, and the isolation structures 130, in accordance with some embodiments. The planarized gate material layer 150 remains between two adjacent isolation structures 130, in accordance with some embodiments.

Figure 2G:
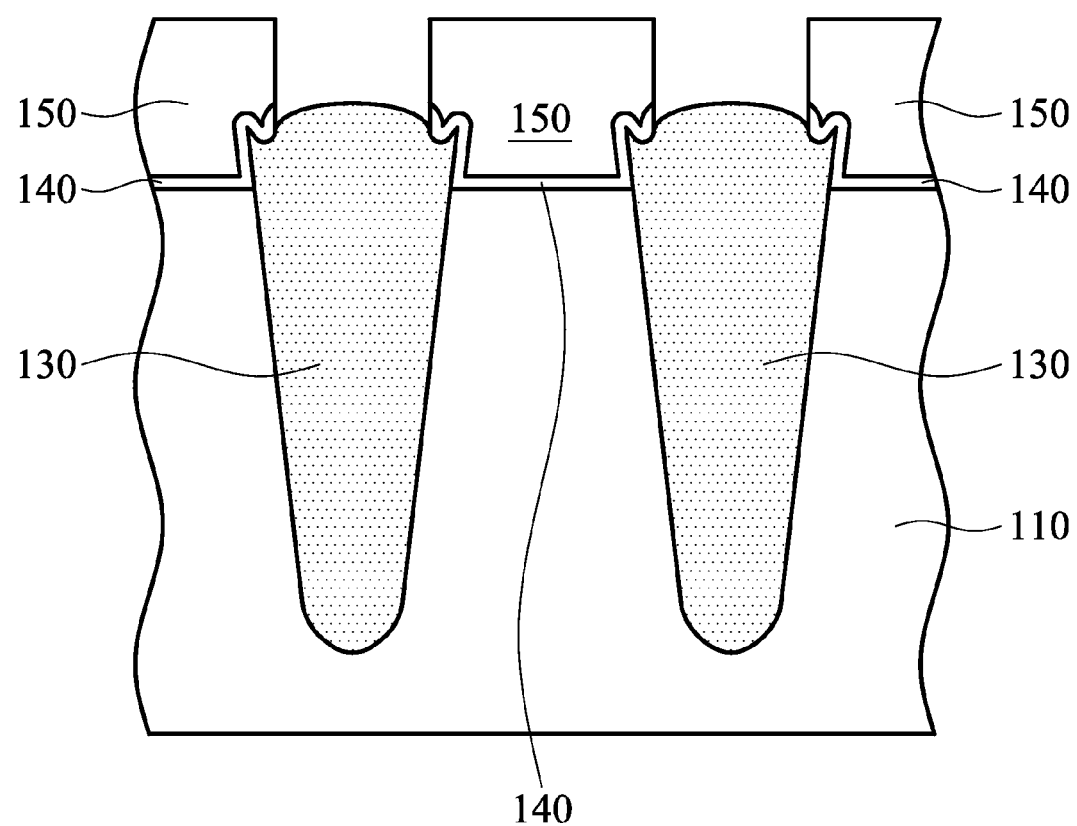

As shown in FIG. 2G, upper portions of the isolation structures 130 are removed, in accordance with some embodiments. The removal process further removes the gate dielectric material layer 140 adjacent to the removed upper portions, in accordance with some embodiments. The removal process includes a wet etching process, in accordance with some embodiments.

Figure 2H:
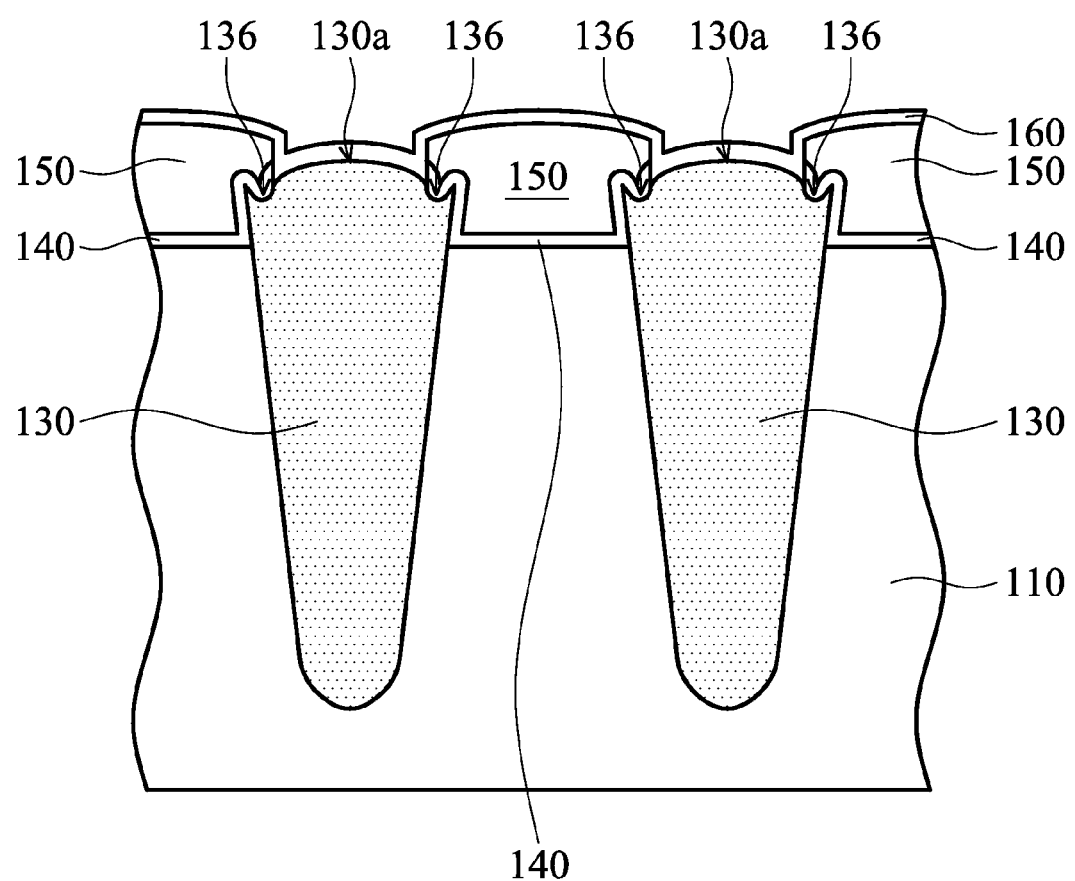
Figure 2:
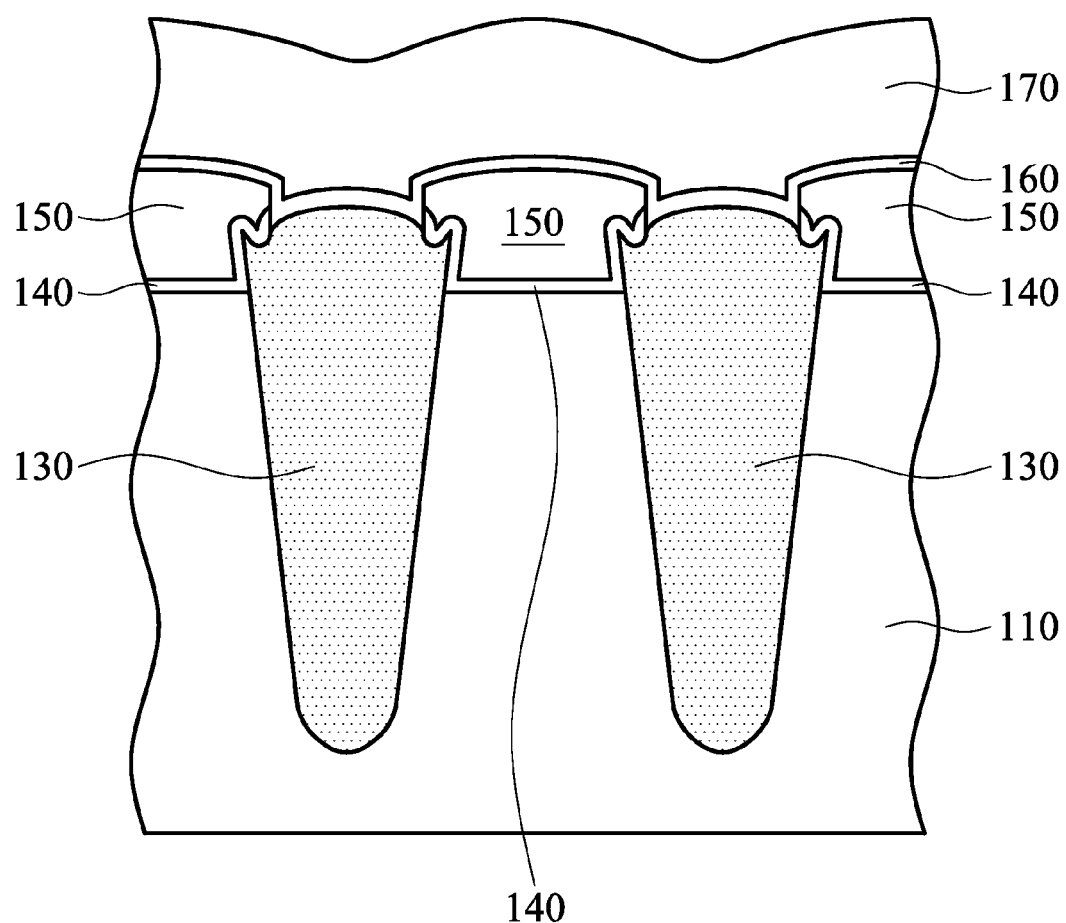

As shown in FIG. 2H, the gate material layer 150 is thinned, in accordance with some embodiments. The thinning process includes an etching back process, such as a wet etching process, in accordance with some embodiments. Each of the isolation structures 130 has an upper surface 130a, in accordance with some embodiments. The upper surface 130a of each of the isolation structures 130 protrude from the substrate 110, in accordance with some embodiments.

Each of the upper surfaces 130a has a corresponding recess 136, in accordance with some embodiments. As shown in FIG. 2H, a dielectric layer 160 is formed over the gate material layer 150, in accordance with some embodiments. The dielectric layer 160 conformally covers the gate material layer 150 and the upper surfaces 130a of the isolation structures 130, in accordance with some embodiments.

The dielectric layer 160 includes a silicon dioxide layer, a silicon nitride layer, and another silicon dioxide layer, in accordance with some embodiments. The silicon nitride layer is positioned between the silicon dioxide layers, in accordance with some embodiments. The dielectric layer 160 is also referred to as an ONO (oxide/nitride/oxide) layer, in accordance with some embodiments. In some other embodiments, the dielectric layer 160 includes other suitable materials. The dielectric layer 160 is formed using a chemical vapor deposition process, in accordance with some embodiments.

As shown in FIG. 2I, a gate material layer 170 is deposited over the dielectric layer 160, in accordance with some embodiments. In some embodiments, the gate material layer 170 is also referred to as a control-gate material layer. The gate material layer 170 is made of polysilicon, in accordance with some embodiments. The gate material layer 170 is deposited using a chemical vapor deposition process, in accordance with some embodiments.

Figure 2J:
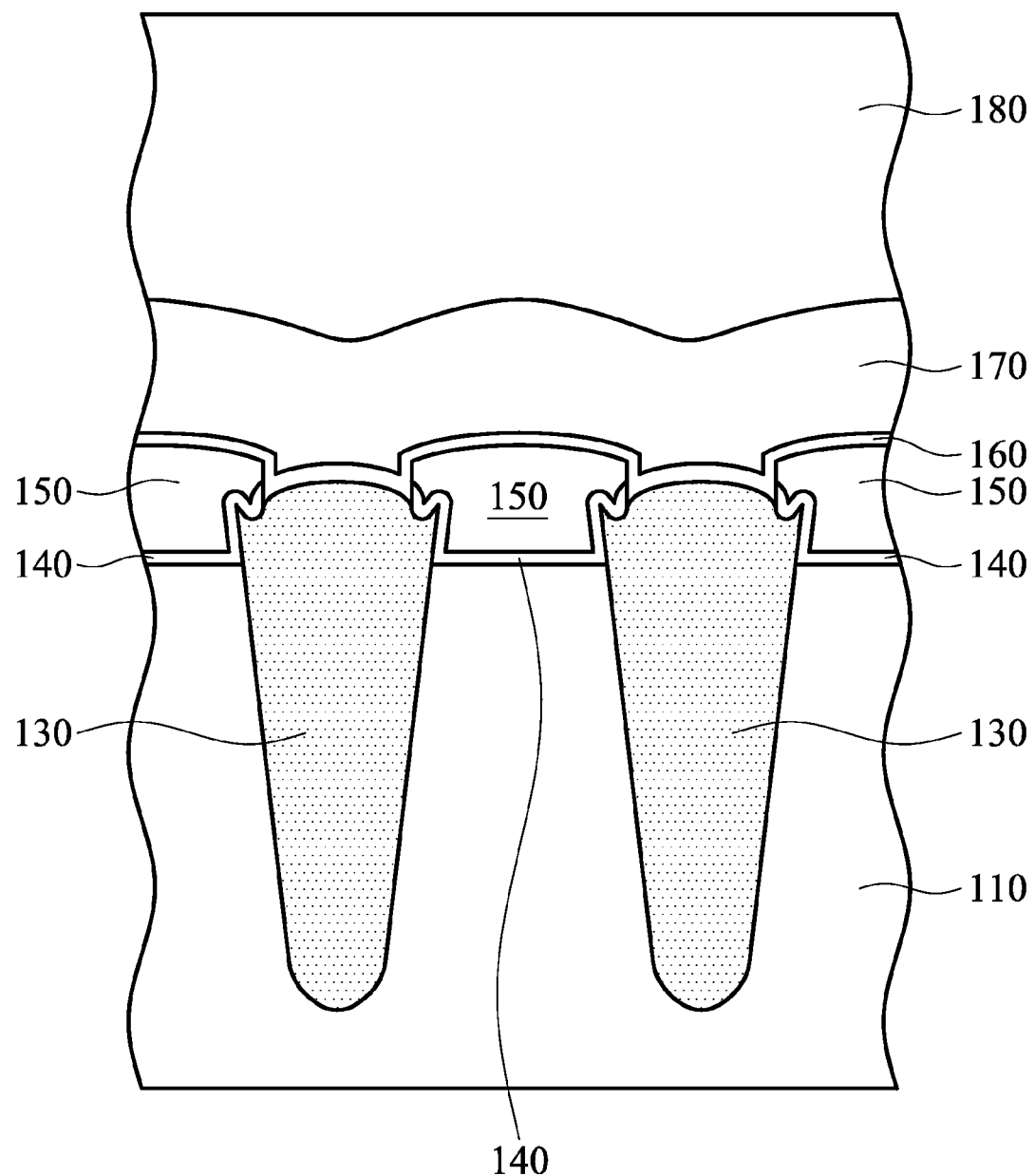

As shown in FIG. 2J, a mask layer 180 is formed over the gate material layer 170, in accordance with some embodiments. In some embodiments, the mask layer 180 includes nitride, such as silicon nitride, silicon oxynitride, or the like. The mask layer 180 is formed by a depositing process (such as a chemical vapor deposition process), in accordance with some embodiments.

Figure 3A:
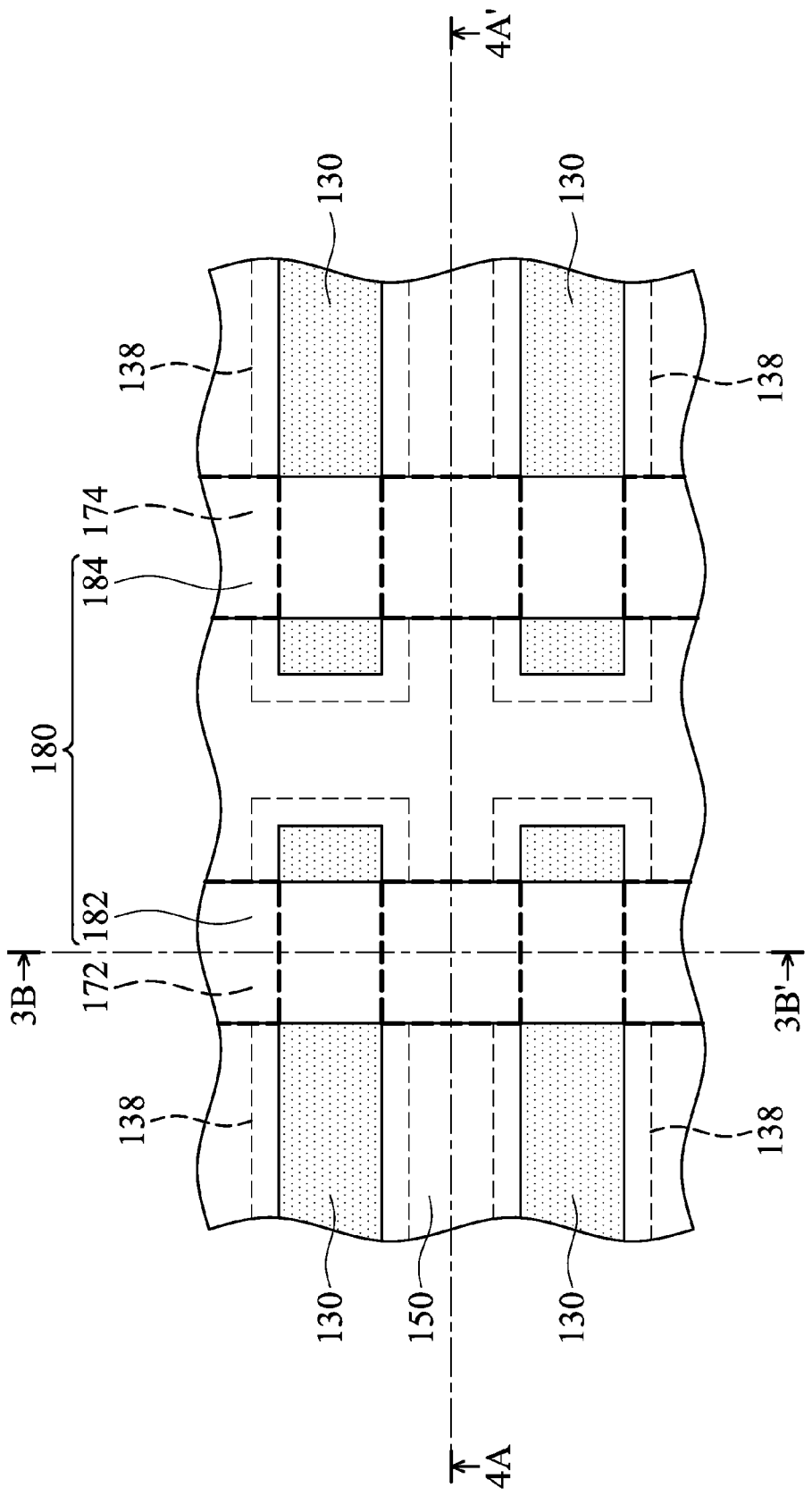
FIG. 3A is a top view of a semiconductor device structure, in accordance with some embodiments.
Figure 3B:
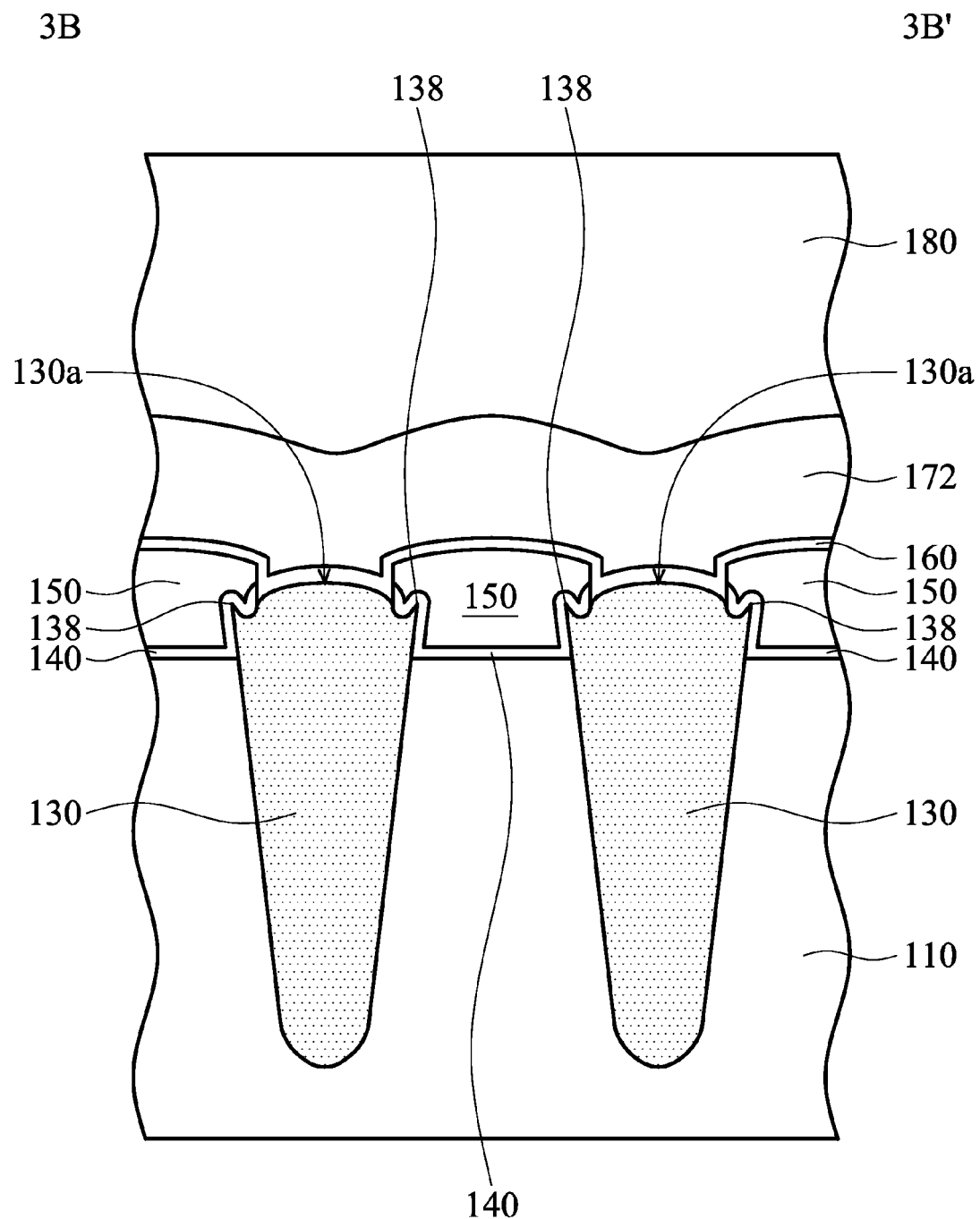
FIG. 3B is a cross-sectional view illustrating the semiconductor device structure along sectional line 3B-3B' in FIG. 3A, in accordance with some embodiments.
Figure 4A:
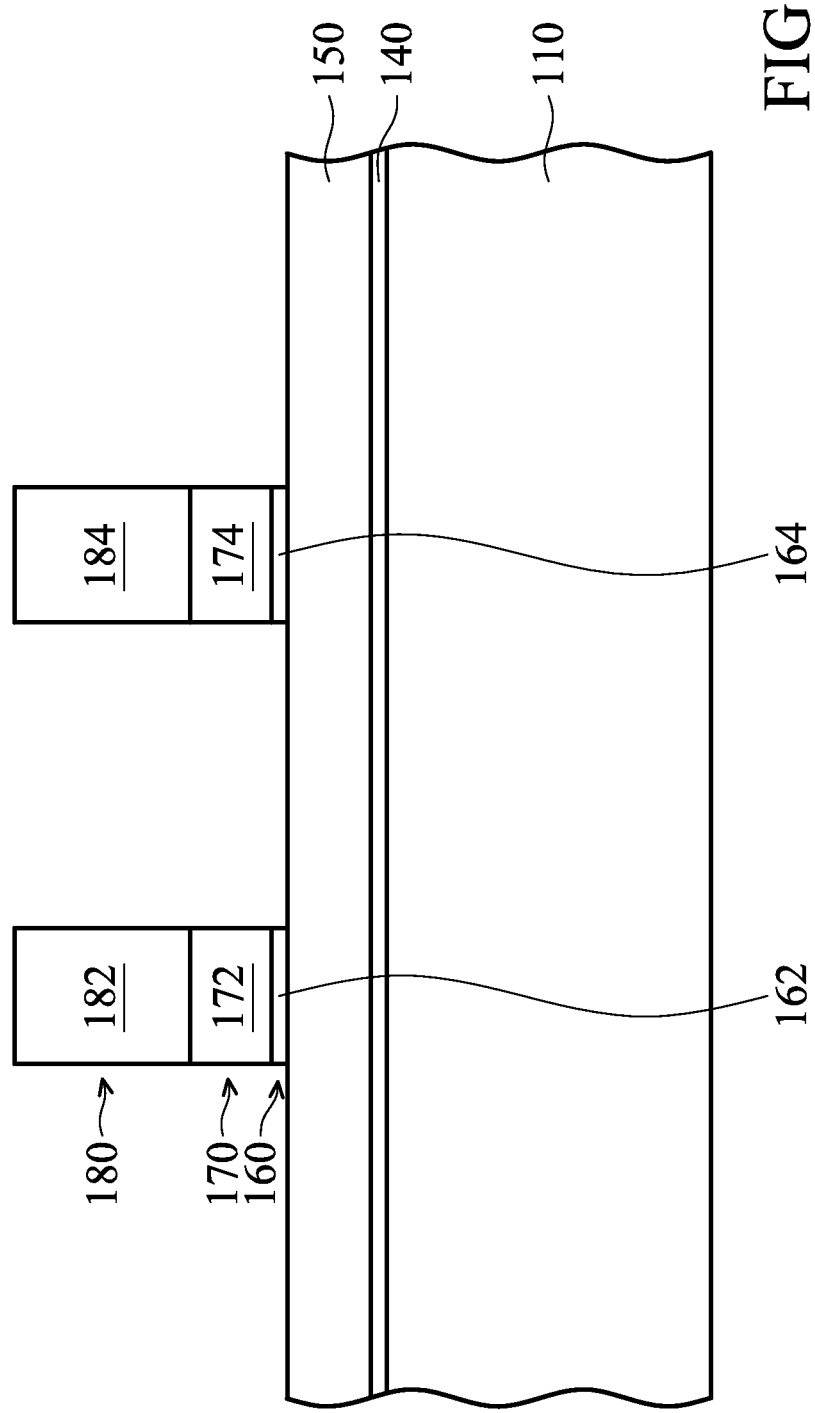
FIGS. 4A-4K are cross-sectional views of various stages of a process for forming a semiconductor device structure, in accordance with some embodiments.

FIG. 3A is a top view of a semiconductor device structure, in accordance with some embodiments. FIG. 3B is a cross-sectional view illustrating the semiconductor device structure along sectional line 3B-3B' in FIG. 3A, in accordance with some embodiments. FIG. 4A is a cross-sectional view illustrating the semiconductor device structure along sectional line 4A-4A' in FIG. 3A, in accordance with some embodiments. FIGS. 4A-4K are cross-sectional views of various stages of a process for forming a semiconductor device structure 100, in accordance with some embodiments.

As shown in FIGS. 3A, 3B, and 4A, after the step of FIG. 2J, a portion of the mask layer 180 is removed, in accordance with some embodiments. The removal process includes a photolithography process and an etching process, in accordance with some embodiments. The etching process includes a dry etching process, in accordance with some embodiments. After the removal process, the remaining mask layer 180 includes mask structures 182 and 184 separated from each other, in accordance with some embodiments.

Thereafter, an etching process is performed on the gate material layer 170 and the dielectric structure 160 using the mask structures 182 and 184 as an etching mask, in accordance with some embodiments. The etching process includes a dry etching process, in accordance with some embodiments.

After the etching process, the remaining gate material layer 170 includes control gates 172 and 174 separated from each other, in accordance with some embodiments. The remaining dielectric structure 160 includes dielectric layers 162 and 164 separated from each other, in accordance with some embodiments. Furthermore, as shown in FIGS. 3A and 3B, the gate material layer 150 partially overlaps the upper surfaces 130a of the isolation structures 130, in accordance with some embodiments. The gate material layer 150 overlaps the edges 138 of the isolation structures 130, in accordance with some embodiments.

Figure 4B:
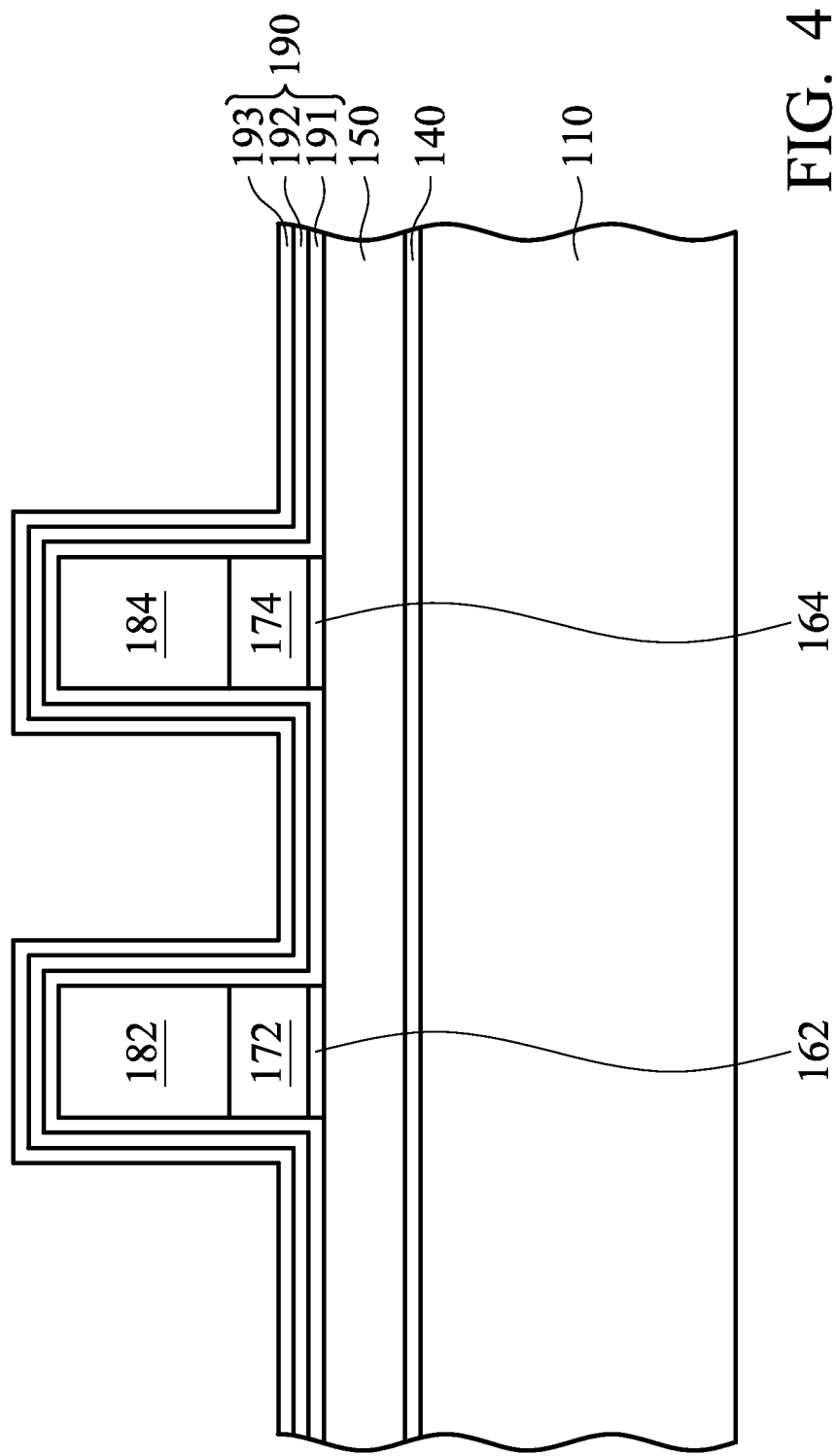

As shown in FIG. 4B, a dielectric structure 190 is deposited over the gate material layer 150 to cover the dielectric layers 162 and 164, the control gates 172 and 174, and the mask structures 182 and 184, in accordance with some embodiments. The dielectric structure 190 includes a silicon dioxide layer 191, a silicon nitride layer 192, and a silicon dioxide layer 193, in accordance with some embodiments.

The silicon nitride layer 192 is positioned between the silicon dioxide layers 191 and 193, in accordance with some embodiments. The dielectric structure 190 is also referred to as an ONO (oxide/nitride/oxide) layer, in accordance with some embodiments. In some other embodiments, the dielectric structure 190 includes other suitable materials. The silicon dioxide layer 191, the silicon nitride layer 192, and the silicon dioxide layer 193 are formed using chemical vapor deposition processes, in accordance with some embodiments.

Figure 4C:
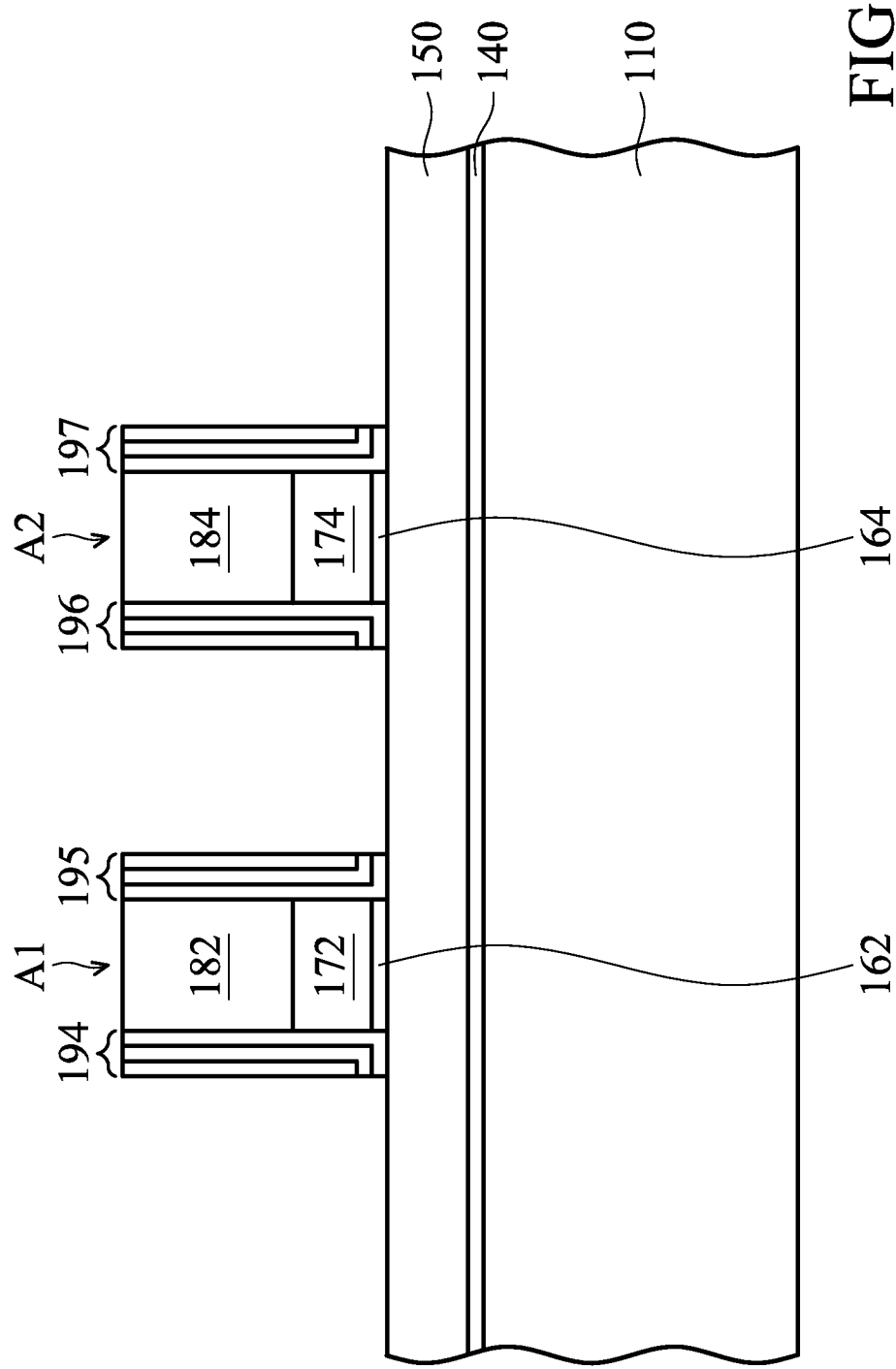

As shown in FIG. 4C, a portion of the dielectric structure 190 is removed, in accordance with some embodiments. The portion of the dielectric structure 190 is removed using an anisotropic etching process, in accordance with some embodiments. The anisotropic etching process includes a dry etching process, in accordance with some embodiments. The remaining dielectric structure 190 includes spacers 194, 195, 196, and 197 spaced apart from each other, in accordance with some embodiments.

The spacers 194 and 195 are located over two opposite sidewalls of the stack A1, which includes the dielectric layer 162, the control gate 172, and the mask structure 182, in accordance with some embodiments. The spacers 196 and 197 are located over two opposite sidewalls of the stack A2, which includes the dielectric layer 164, the control gate 174, and the mask structure 184, in accordance with some embodiments.

Figure 4D:
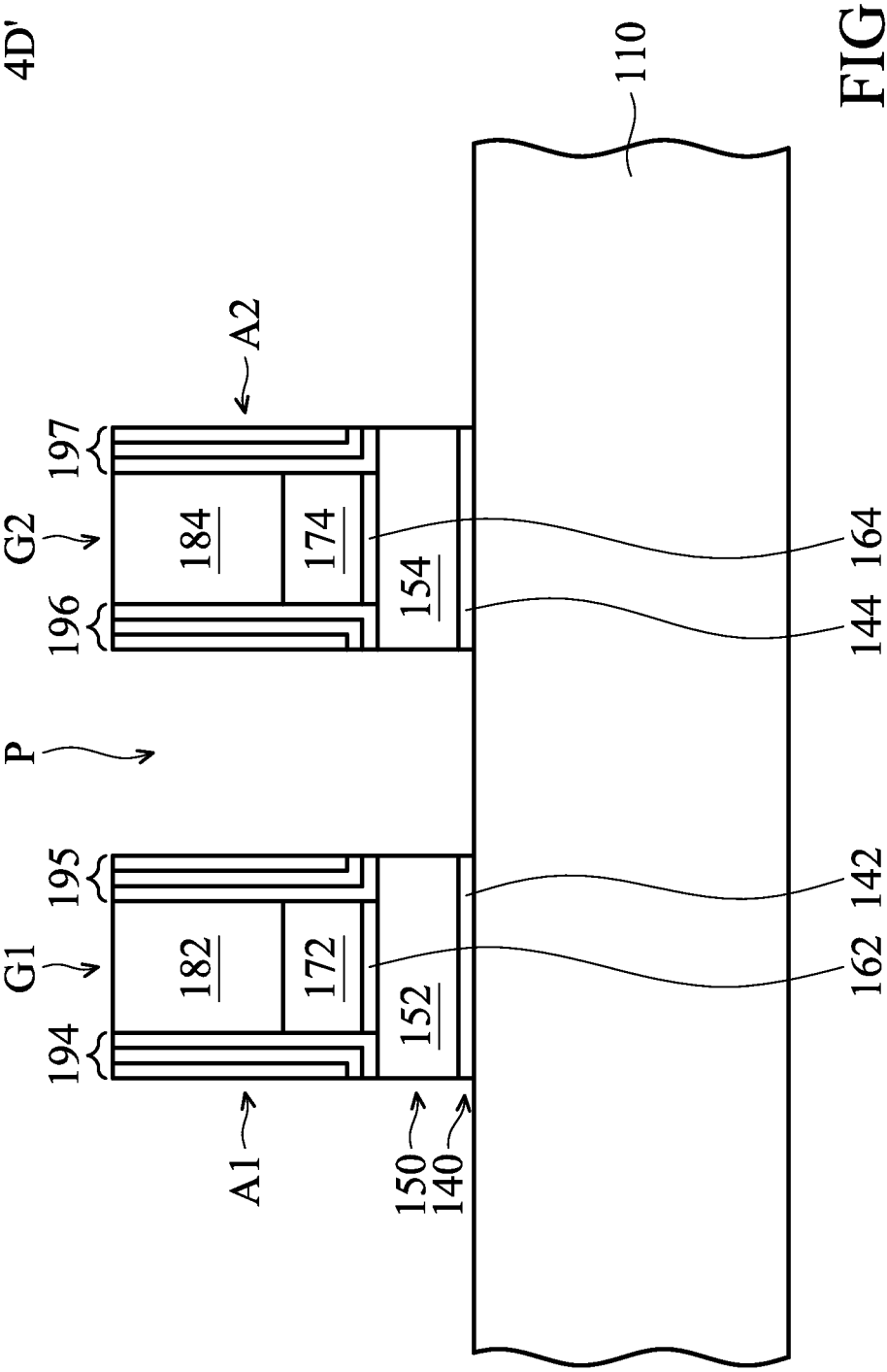
Figure 5A:
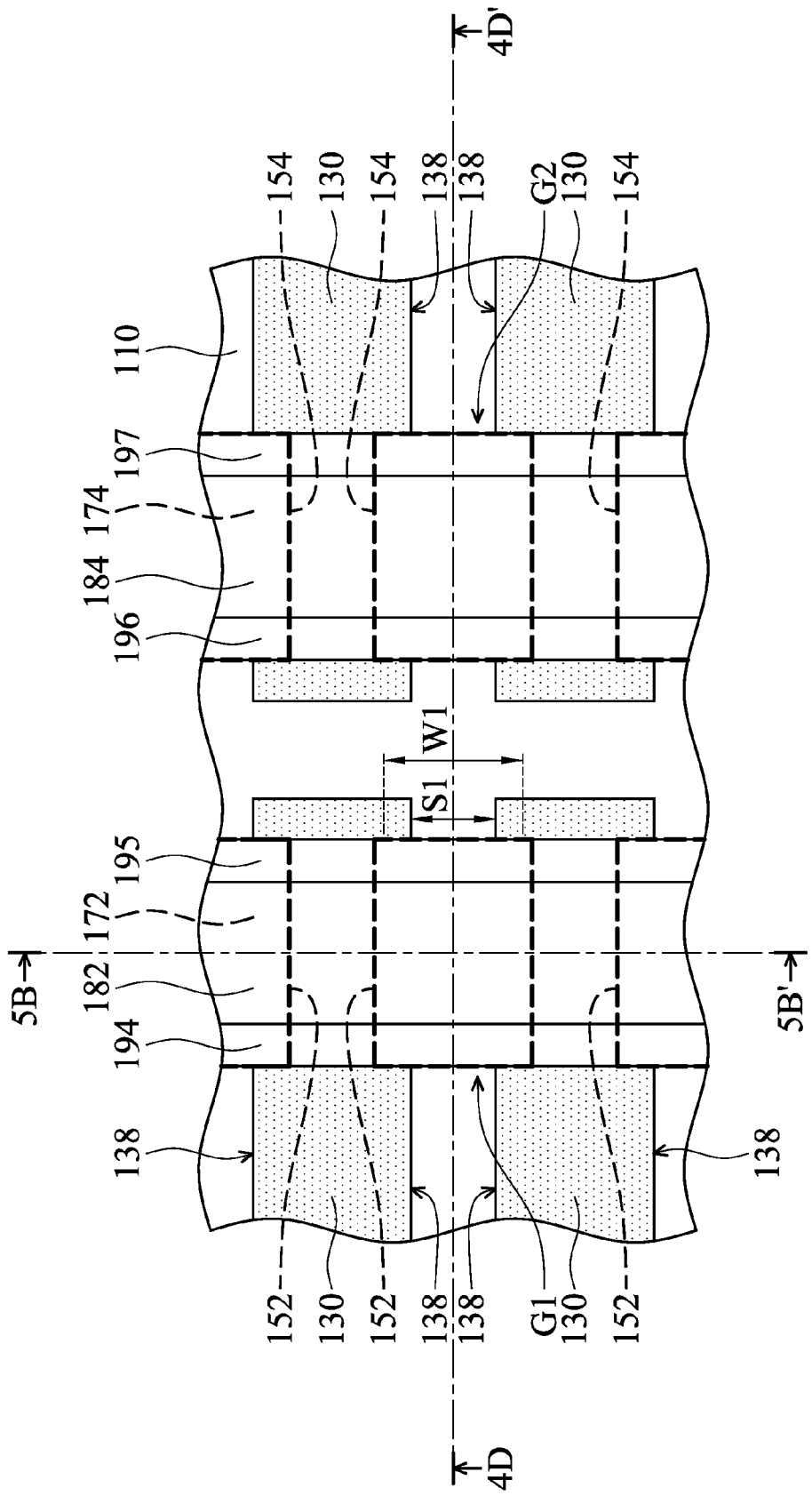
FIG. 5A is a top view of a semiconductor device structure of FIG. 4D, in accordance with some embodiments.
Figure 5B:
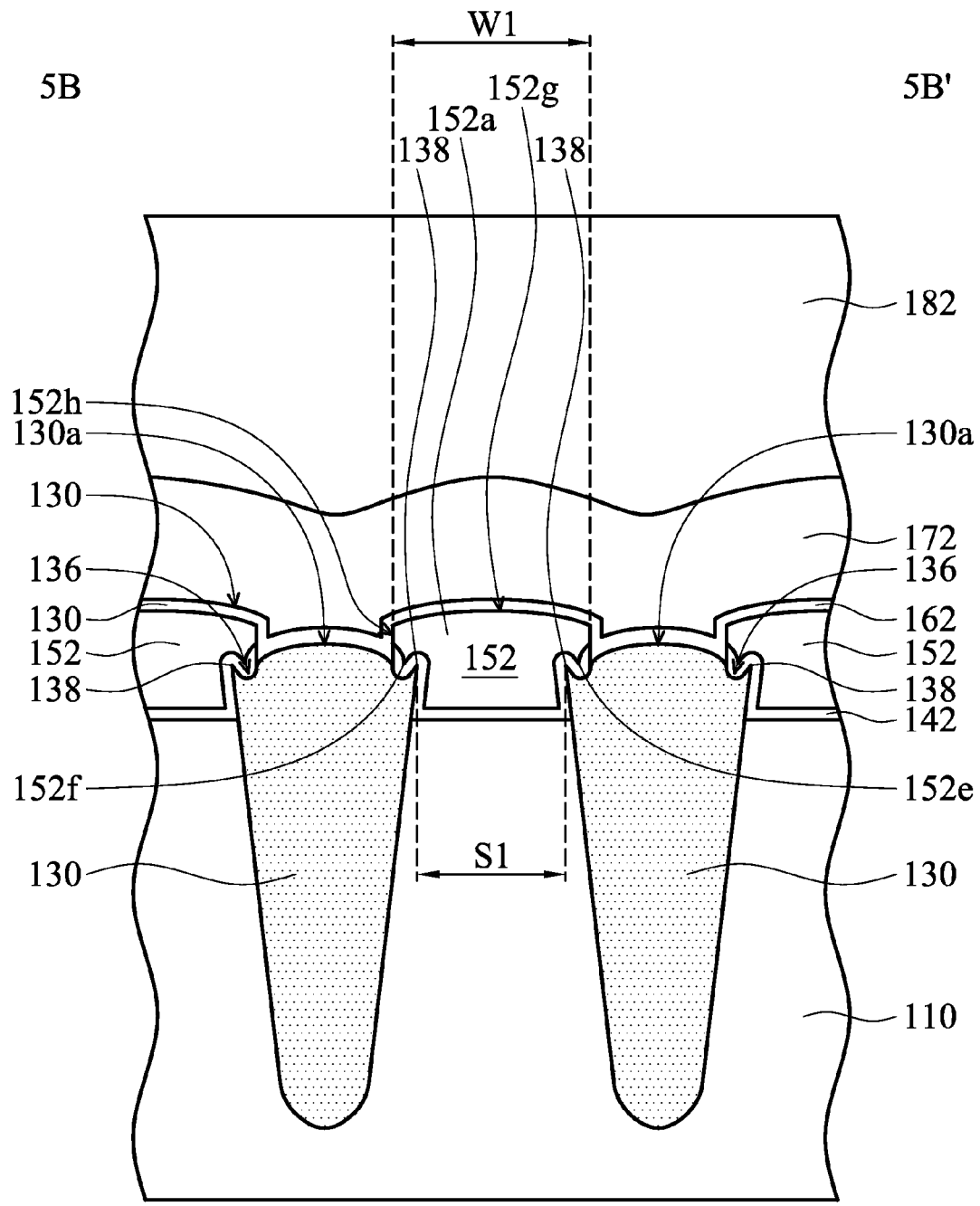
FIG. 5B is a cross-sectional view illustrating the semiconductor device structure along sectional line 5B-5B' in FIG. 5A, in accordance with some embodiments.

FIG. 5A is a top view of a semiconductor device structure of FIG. 4D, in accordance with some embodiments. FIG. 4D is a cross-sectional view illustrating the semiconductor device structure along sectional line 4D-4D' in FIG. 5A, in accordance with some embodiments. FIG. 5B is a cross-sectional view illustrating the semiconductor device structure along sectional line 5B-5B' in FIG. 5A, in accordance with some embodiments.

As shown in FIGS. 4D, 5A, and 5B, after the step of FIG. 4C, portions of the gate material layer 150 and the gate dielectric material layer 140 are removed, in accordance with some embodiments. The removal process includes a dry etching process using the stacks A1 and A2 as an etching mask, in accordance with some embodiments. After the removal process, the remaining gate material layer 150 includes floating gates 152 and 154 separated from each other, in accordance with some embodiments. The floating gate 152 (or 154) is in a T-like shape (as shown in FIG. 5B), in accordance with some embodiments.

The floating gate 152 (or 154) is positioned over the substrate 110 and between the isolation structures 130, in accordance with some embodiments. The floating gate 152 (or 154) extends onto the upper surfaces 130a of the isolation structures 130 adjacent to the floating gate 152 (or 154), in accordance with some embodiments. Therefore, the floating gate 152 (or 154) covers the edges 138 and the recesses 136 of the isolation structures 130, in accordance with some embodiments.

The edges 138 (also referred to as protruding edges) extend away from the substrate 110 and into the floating gate 152, in accordance with some embodiments. The floating gate 152 has protruding edges 152e and 152f extending toward the substrate 110, in accordance with some embodiments. The protruding edges 152e and 152f are located over the edges 138, respectively, in accordance with some embodiments.

The control gate 172 is located over the floating gates 152, in accordance with some embodiments. The control gate 172 covers upper surfaces 152g and sidewalls 152h of the floating gates 152, in accordance with some embodiments. The control gate 174 is located over the floating gates 154, in accordance with some embodiments. The remaining gate dielectric material layer 140 includes gate dielectric layers 142 and 144 separated from each other, in accordance with some embodiments.

In some embodiments, a gate stack G1 including the floating gate 152, the dielectric layer 162, and the control gate 172 is formed. In some embodiments, the gate stack G1 further includes the gate dielectric layer 142, the mask structure 182, and the spacers 194 and 195. In some embodiments, a gate stack G2 including the floating gate 154, the dielectric layer 164, and the control gate 174 is formed. In some embodiments, the gate stack G2 further includes the gate dielectric layer 144, the mask structure 184, and the spacers 196 and 197. The gate stacks G1 and G2 are separated from each other by a gap P, in accordance with some embodiments.

As shown in FIGS. 5A and 5B, in the gate stack G1, since the floating gate 152 extends onto (or overlaps) the upper surfaces 130a of the isolation structures 130, the width W1 of an upper portion 152a of the floating gate 152 is increased. Therefore, the overlapping area between the floating gate 152 and the control gate 172 is enlarged as well. As a result, the coupling ratio of the control gate 172 to the floating gate 152 is improved, in accordance with some embodiments. In some embodiments, the width W1 is greater than the distance S1 between the isolation structures 130.

Figure 4E:
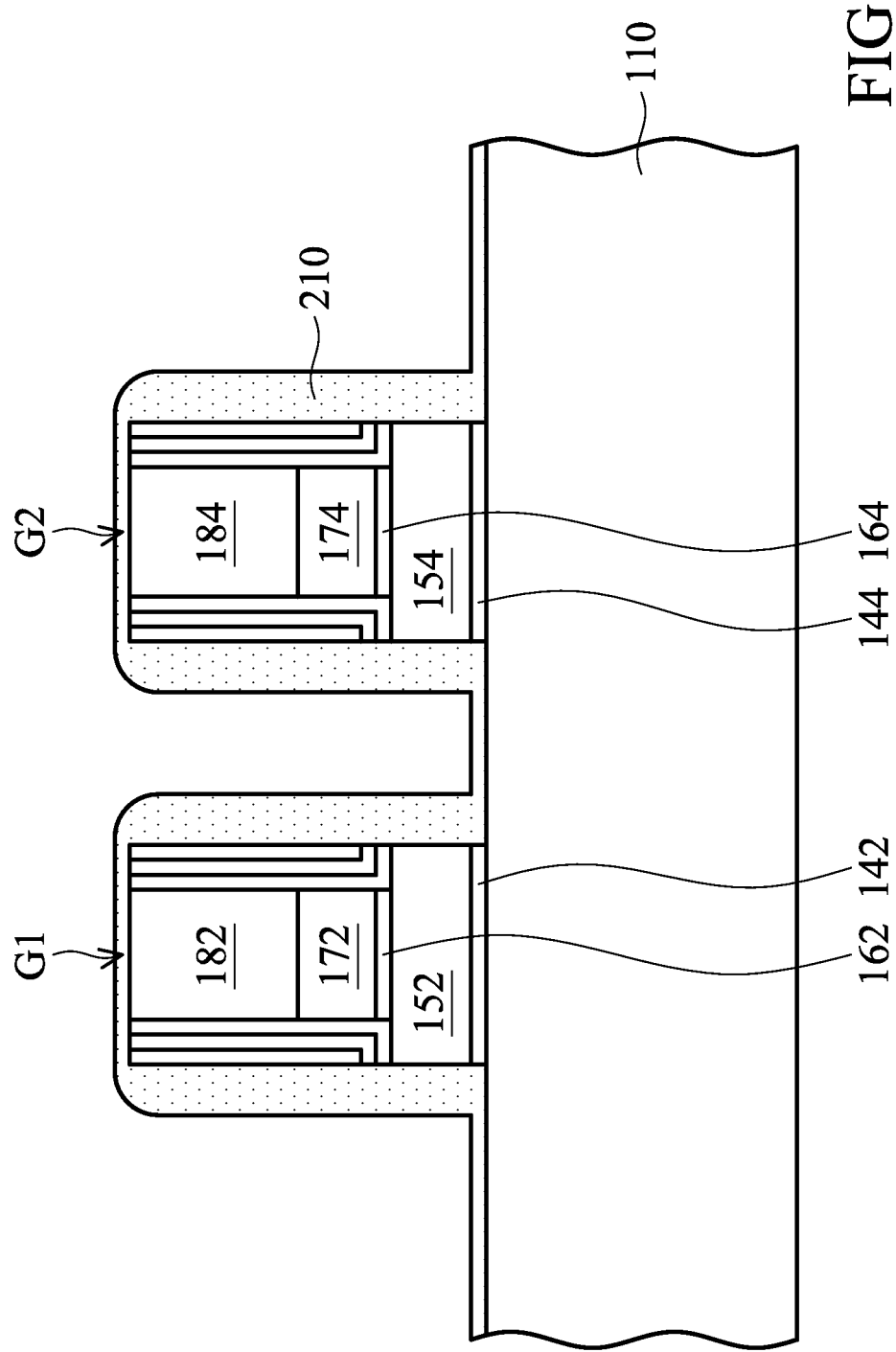

As shown in FIG. 4E, a spacer material layer 210 is formed over the semiconductor substrate 110, in accordance with some embodiments. The spacer material layer 210 includes oxide, such as silicon oxide, in accordance with some embodiments. The spacer material layer 210 is formed using a high-temperature oxidation (HTO) process, in accordance with some embodiments. Thereafter, the spacer material layer 210 over the gate stacks G1 and G2 and the semiconductor substrate 110 is thinned, in accordance with some embodiments. The thinning process includes a dry etching process, in accordance with some embodiments.

Figure 4F:
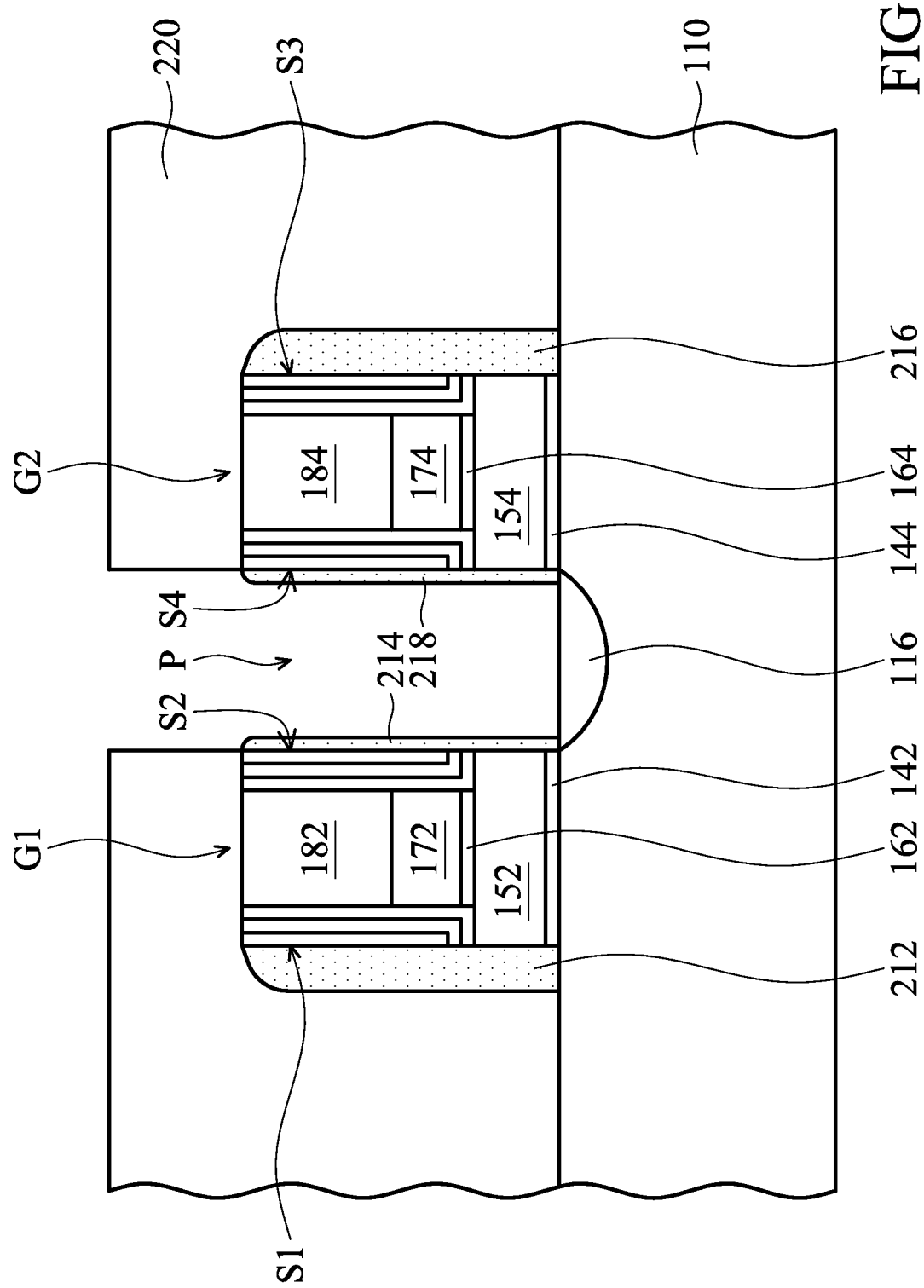

As shown in FIG. 4F, the spacer material layer 210 over the gate stacks G1 and G2 and the semiconductor substrate 110 is removed, in accordance with some embodiments. The removal process includes, for example, a wet etching process. After the removal process, the remaining spacer material layer 210 includes spacers 212, 214, 216, and 218, in accordance with some embodiments.

The gate stack G1 has two opposite sidewalls S1 and S2, in accordance with some embodiments. The spacers 212 and 214 are located over the sidewalls S1 and S2, respectively, in accordance with some embodiments. The gate stack G2 has two opposite sidewalls S3 and S4, in accordance with some embodiments. The spacers 216 and 218 are located over the sidewalls S3 and S4, respectively, in accordance with some embodiments. In some embodiments, the sidewalls S1 and S3 face away from the gap P, and the sidewalls S2 and S4 face the gap P.

As shown in FIG. 4F, a mask layer 220 is formed over the semiconductor substrate 110 to cover the gate stacks G1 and G2 and the spacers 212 and 216, in accordance with some embodiments. The mask layer 220 exposes the spacers 214 and 218, in accordance with some embodiments. The mask layer 220 includes, for example, a photoresist layer.

Thereafter, the spacers 214 and 218 are thinned, in accordance with some embodiments. The thinning process includes an etching process, in accordance with some embodiments. After the thinning process, the thinned spacers 214 and 218 are configured to protect the sidewall S2 of the gate stack G1 and the sidewall S4 of the gate stack G2 from damage during subsequent processes, in accordance with some embodiments.

As shown in FIG. 4F, a doped region 116 is formed in the semiconductor substrate 110 exposed by the gap P, in accordance with some embodiments. The doped region 116 is doped with n-type impurities (e.g., phosphorus) or p-type impurities (e.g., boron), in accordance with some embodiments. The doped region 116 is formed using, for example, an ion implantation process. The doped region 116 is also referred to as a common source region, in accordance with some embodiments.

Figure 4G:
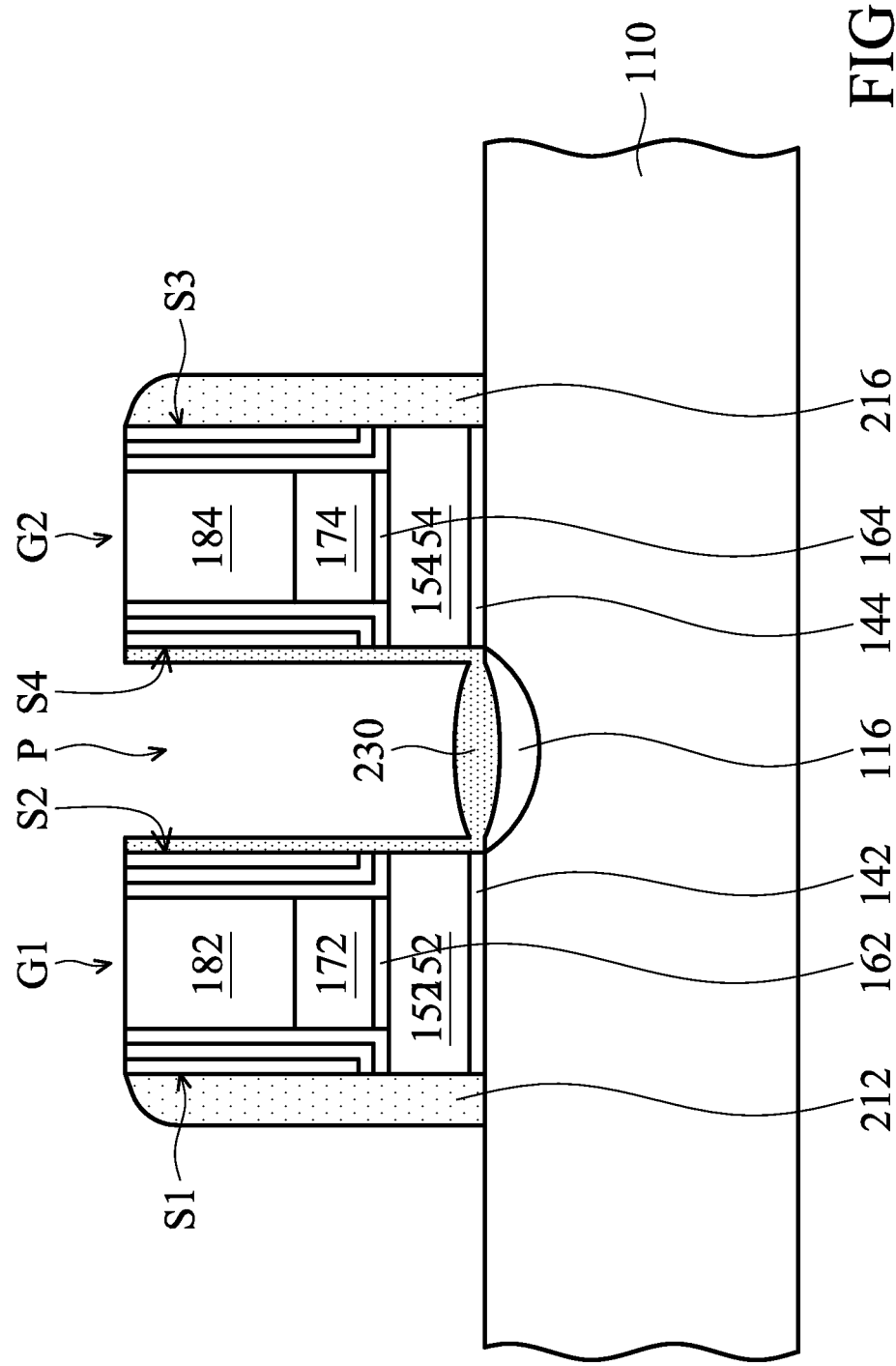

As shown in FIG. 4G, the spacers 214 and 218 are removed, in accordance with some embodiments. The removal process includes a wet etching process, in accordance with some embodiments. Thereafter, the mask layer 220 is removed, in accordance with some embodiments.

As shown in FIG. 4G, an insulating layer 230 is formed over the sidewalls S2 and S4 and the doped region 116, in accordance with some embodiments. The insulating layer 230 is configured to electrically insulate the gate stacks G1 and G2 and the doped region 116 from elements formed in the gap P subsequently, in accordance with some embodiments.

The insulating layer 230 includes oxide (e.g., silicon oxide), in accordance with some embodiments. The insulating layer 230 is formed using oxide deposition processes, a photolithography process, and an etching process, in accordance with some embodiments. The oxide deposition processes includes an in-situ steam generation (ISSG) process, a high-temperature oxidation (HTO) process, and a wet oxidation process, in accordance with some embodiments.

Figure 4H:
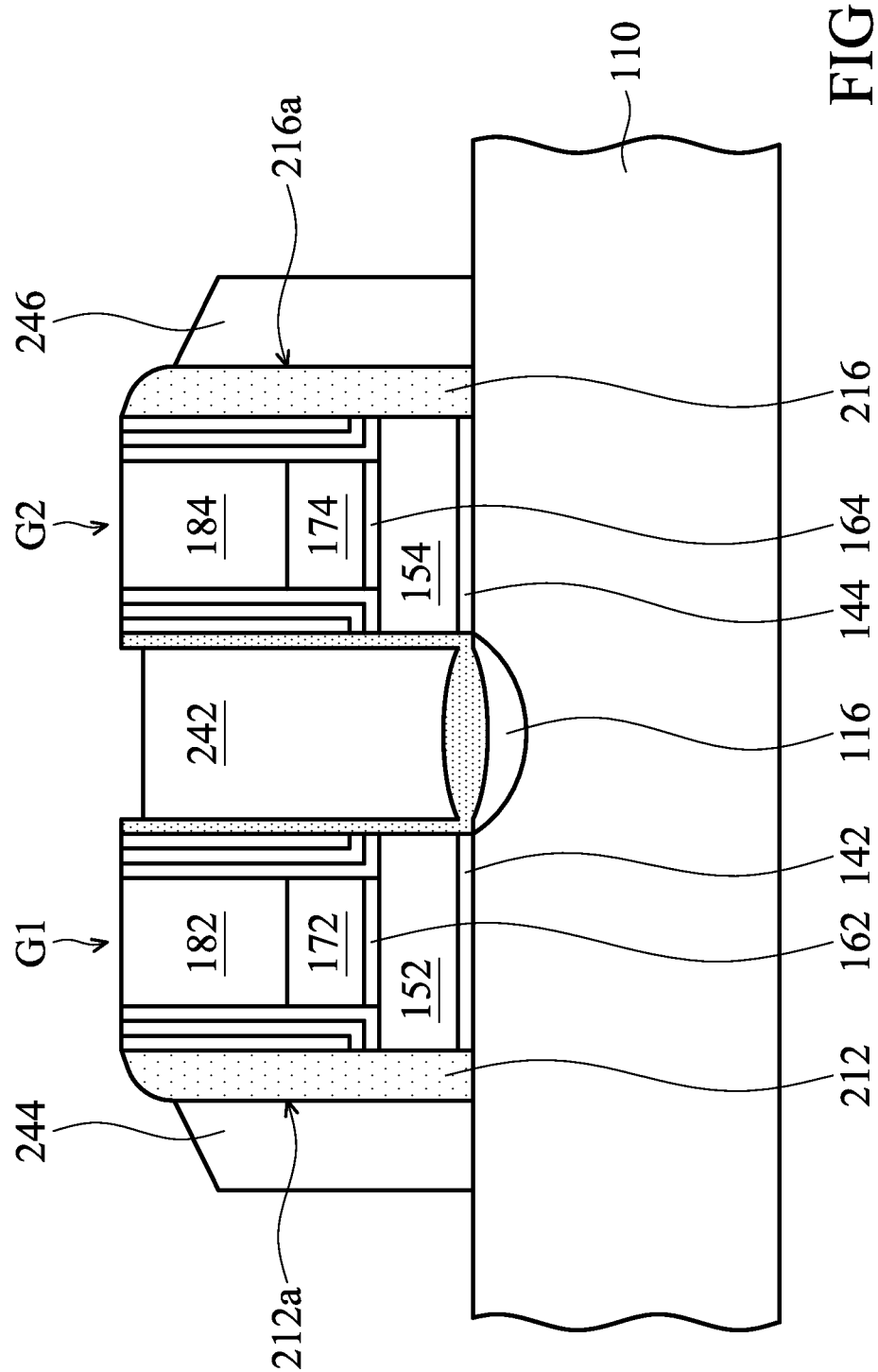
Figure 4:
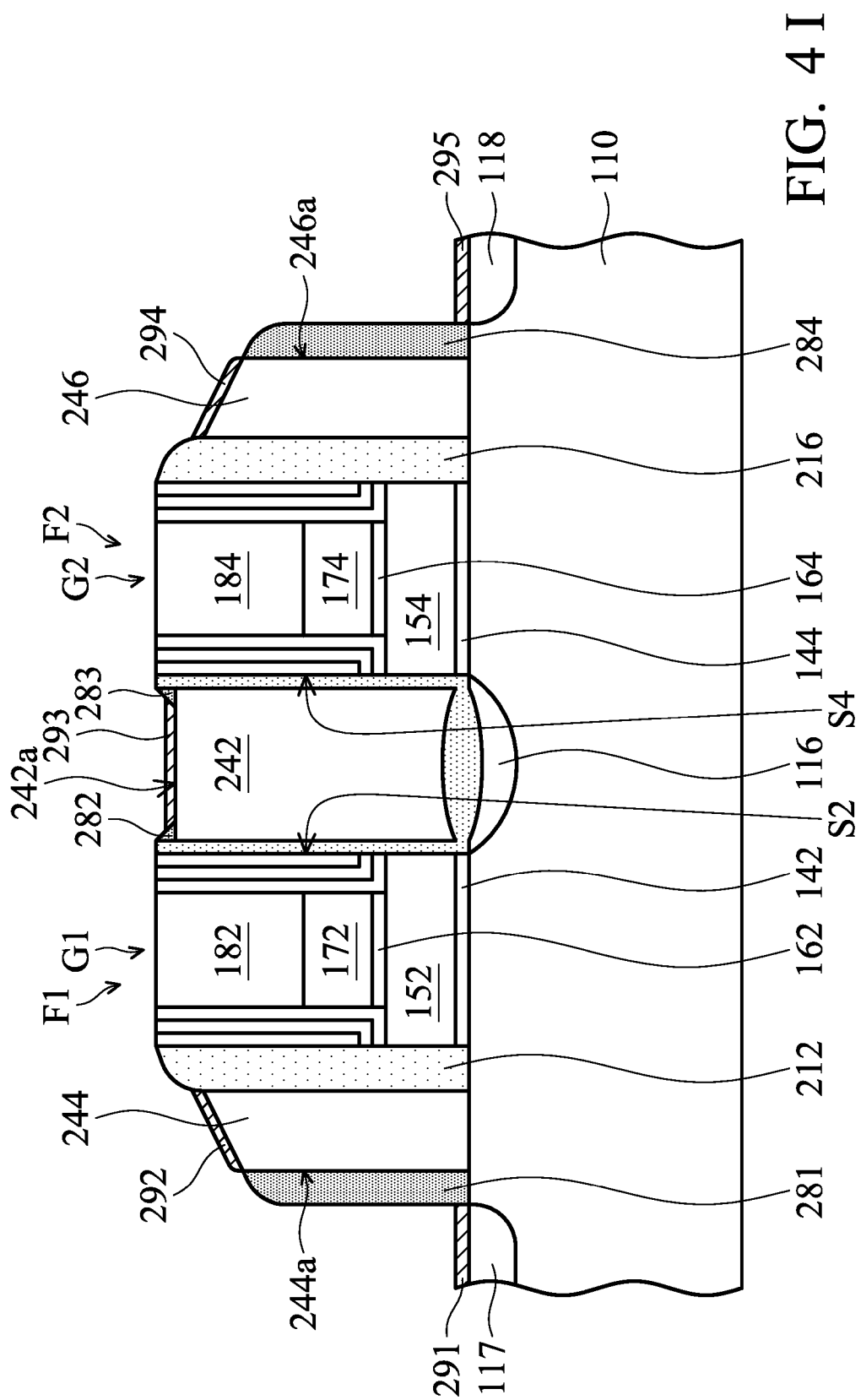
Figure 4:
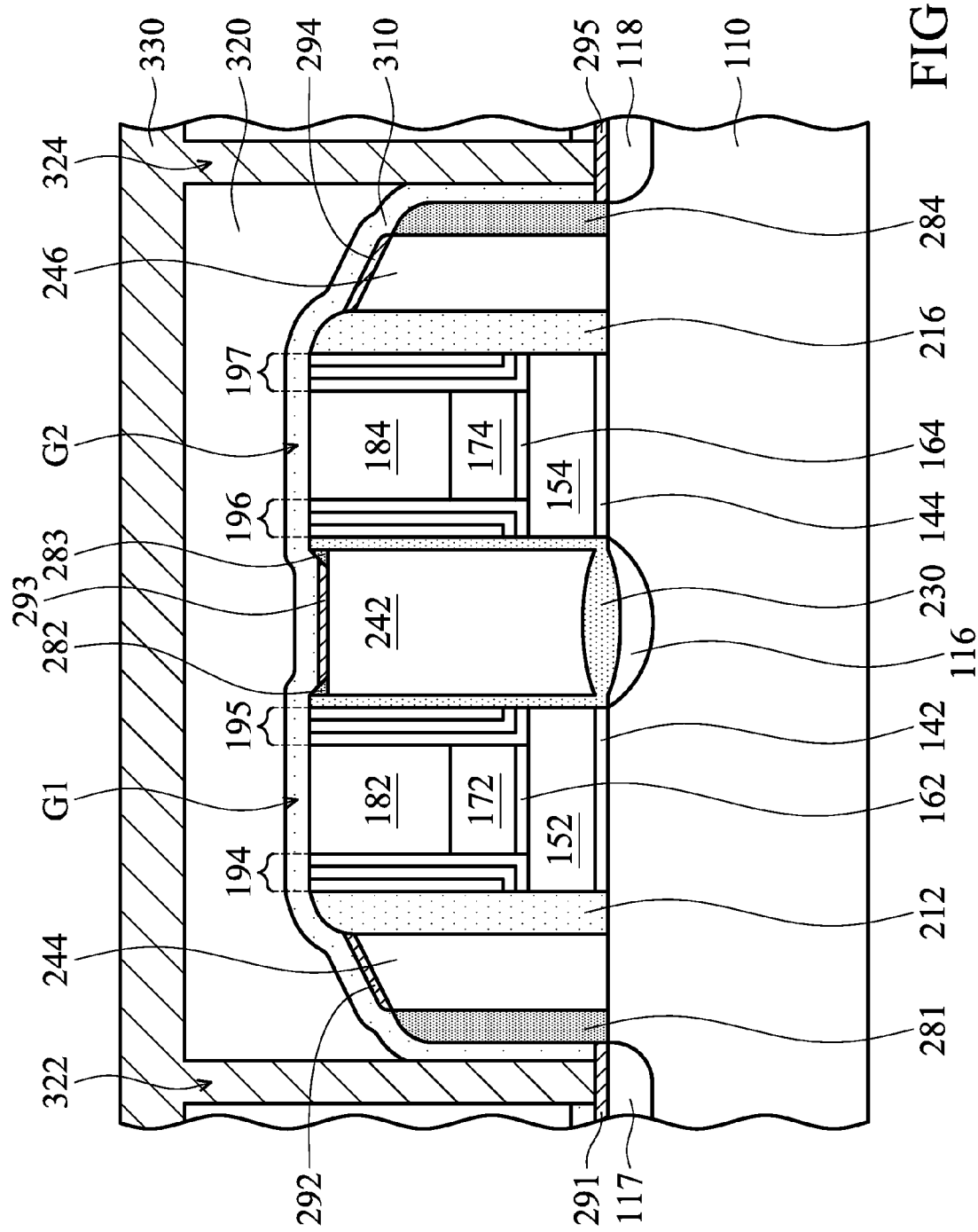

As shown in FIG. 4H, an erase gate 242 and word lines 244 and 246 are formed over the substrate 110, in accordance with some embodiments. The erase gate 242 is formed between the gate stacks G1 and G2, in accordance with some embodiments. The word line 244 is formed over a sidewall 212a of the spacer 212, in accordance with some embodiments. The word line 246 is formed over a sidewall 216a of the spacer 216, in accordance with some embodiments. The erase gate 242 and word lines 244 and 246 include polysilicon or another suitable conductive material.

The erase gate 242 and word lines 244 and 246 are formed using a deposition process (such as a chemical vapor deposition process), an etching back process, a photolithography process, and an etching process, in accordance with some embodiments. In some other embodiments, the erase gate 242 and word lines 244 and 246 are formed using another suitable process.

As shown in FIG. 4I, spacers 281, 282, 283, and 284 are formed, in accordance with some embodiments. The spacer 281 is formed over a sidewall 244a of the word line 244, in accordance with some embodiments.

The spacer 282 is formed over the upper surface 242a of the erase gate 242 and the sidewall S2 of the gate stack G1, in accordance with some embodiments. The spacer 283 is formed over the upper surface 242a of the erase gate 242 and the sidewall S4 of the gate stack G2, in accordance with some embodiments. The spacer 284 is formed over a sidewall 246a of the word line 246, in accordance with some embodiments.

The spacers 281, 282, 283, and 284 include an insulating material, such as silicon oxide or silicon nitride. The spacers 281, 282, 283, and 284 are formed using a deposition process (e.g., a chemical vapor deposition process) and an etching process (e.g., a dry etching process).

As shown in FIG. 4I, doped regions 117 and 118 are formed in the semiconductor substrate 110, in accordance with some embodiments. The doped region 117 is adjacent to the spacer 281, in accordance with some embodiments. The doped region 118 is adjacent to the spacer 284, in accordance with some embodiments. The doped regions 117 and 118 are also referred to as drain regions, in accordance with some embodiments.

The doped regions 117 and 118 are doped with n-type impurities (e.g., phosphorus) or p-type impurities (e.g., boron), in accordance with some embodiments. The doped regions 116, 117, and 118 are doped with the same type impurities, in accordance with some embodiments. The doped regions 117 and 118 are formed using an ion implantation process, in accordance with some embodiments.

As shown in FIG. 4I, metal silicide layers 291, 292, 293, 294, and 295 are formed over the doped region 117, the word line 244, the erase gate 242, the word line 246, and the doped region 118, respectively, in accordance with some embodiments. The metal silicide layer 293 is located over the erase gate 242 and between the spacers 282 and 283, in accordance with some embodiments. The metal silicide layer 293 is in direct contact with the spacers 282 and 283, in accordance with some embodiments.

In this step, memory cells F1 and F2 are substantially formed, in accordance with some embodiments. The memory cells F1 and F2 are also referred to as flash memory cells, in accordance with some embodiments. The memory cell F1 includes the gate stack G1, the erase gate 242, the word line 244, and the doped regions 116 and 117, in accordance with some embodiments. The memory cell F2 includes the gate stack G2, the erase gate 242, the word line 246, and the doped regions 116 and 118, in accordance with some embodiments.

As shown in FIG. 4J, a contact etching stop layer 310 is formed over the semiconductor substrate 110 to cover the metal silicide layers 291, 292, 293, 294, and 295, in accordance with some embodiments. The contact etching stop layer 310 includes a dielectric material, in accordance with some embodiments. The contact etching stop layer 310 includes silicon nitride, in accordance with some embodiments.

The contact etching stop layer 310 is formed over the metal silicide layers 291, 292, 293, 294, and 295, the spacers 212, 216, 281, 282, 283, and 284, the gate stacks G1 and G2, and the semiconductor substrate 110, in accordance with some embodiments. In some other embodiments, the contact etching stop layer 310 is not formed.

As shown in FIG. 4J, an insulating layer 320 is deposited over the contact etching stop layer 310, in accordance with some embodiments. The insulating layer 320 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments.

The insulating layer 320 is deposited using a CVD process, a HDPCVD process, a spin-on process, a sputtering process, or a combination thereof, in accordance with some embodiments. Thereafter, openings 322 and 324 are formed in the insulating layer 320 and the contact etching stop layer 310 to expose the metal silicide layers 291 and 295, respectively, in accordance with some embodiments. The openings 322 and 324 are formed using a photolithography process and an etching process, in accordance with some embodiments.

As shown in FIG. 4J, a conductive layer 330 is deposited over the insulating layer 320 and is filled into the openings 322 and 324 to electrically contact the metal silicide layers 291 and 295, in accordance with some embodiments. The conductive layer 330 is formed by, for example, a PVD process or other suitable processes. The conductive layer 330 is made of, for example, tungsten or other suitable conductive materials.

Figure 4K:
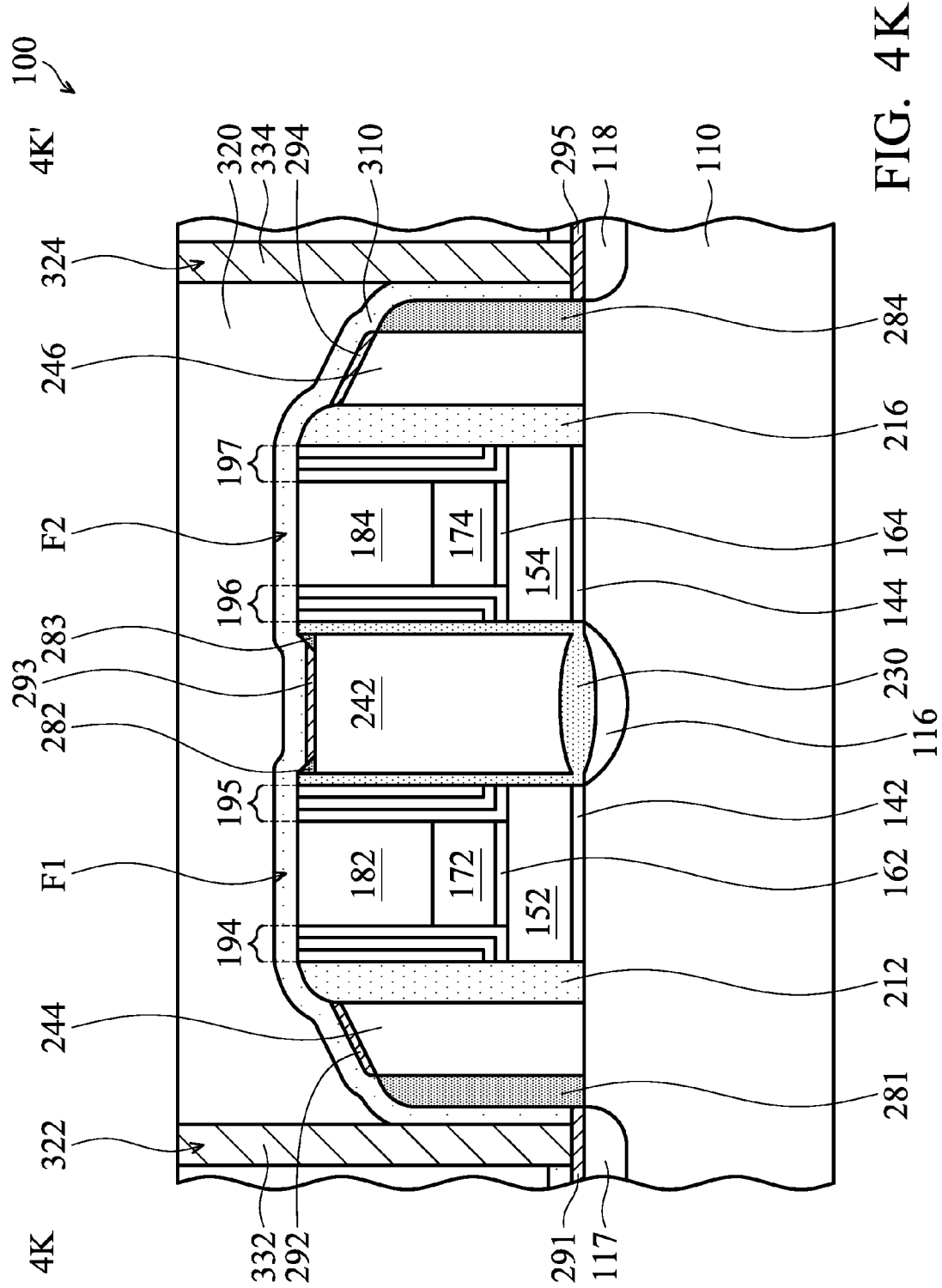
Figure 6A:
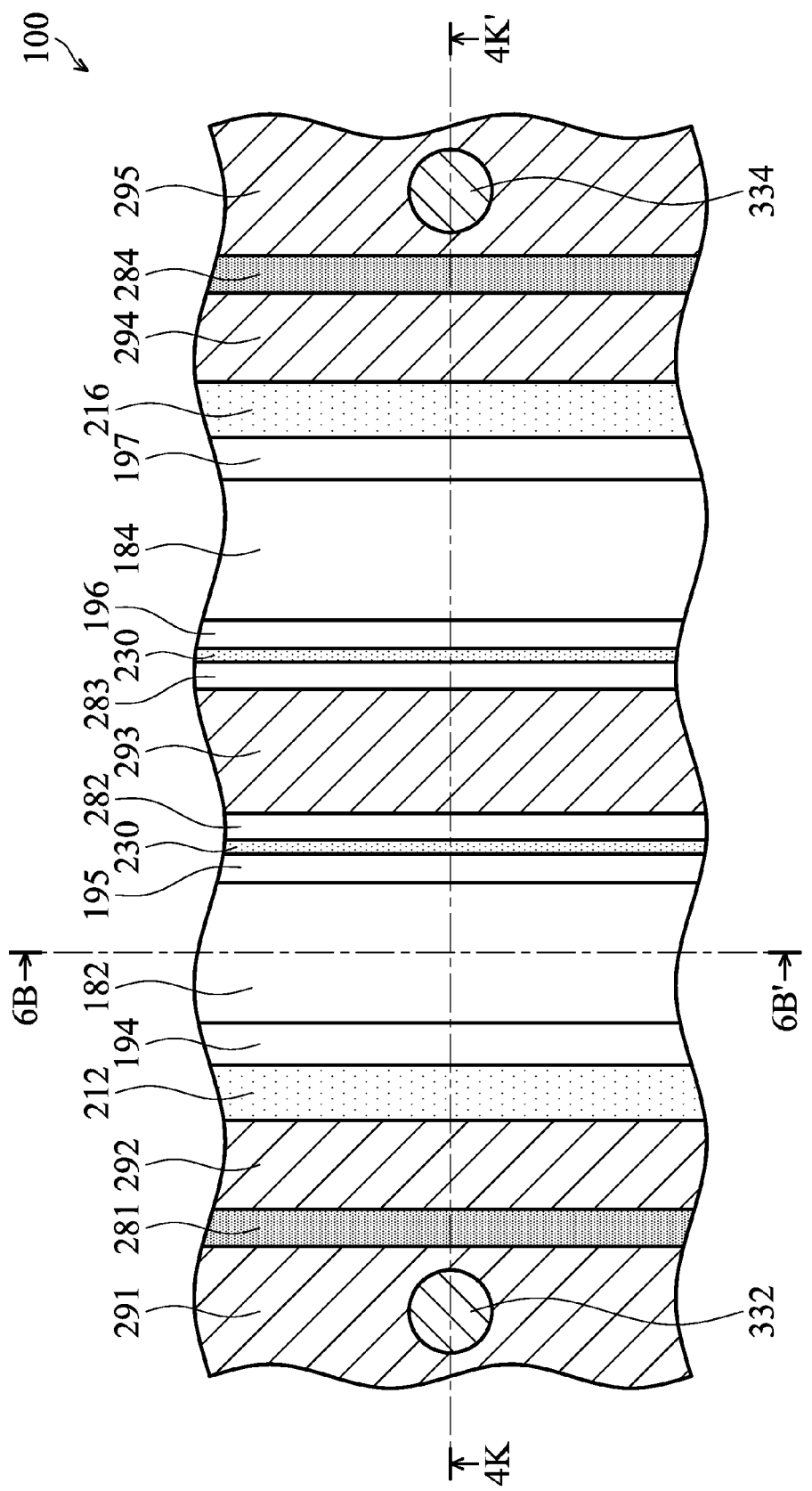
FIG. 6A is a top view of a semiconductor device structure of FIG. 4K, in accordance with some embodiments.

FIG. 6A is a top view of a semiconductor device structure 100 of FIG. 4K, in accordance with some embodiments. For the sake of simplicity, the contact etching stop layer 310 and the insulating layer 320 are omitted in FIG. 6A.

Figure 6B:
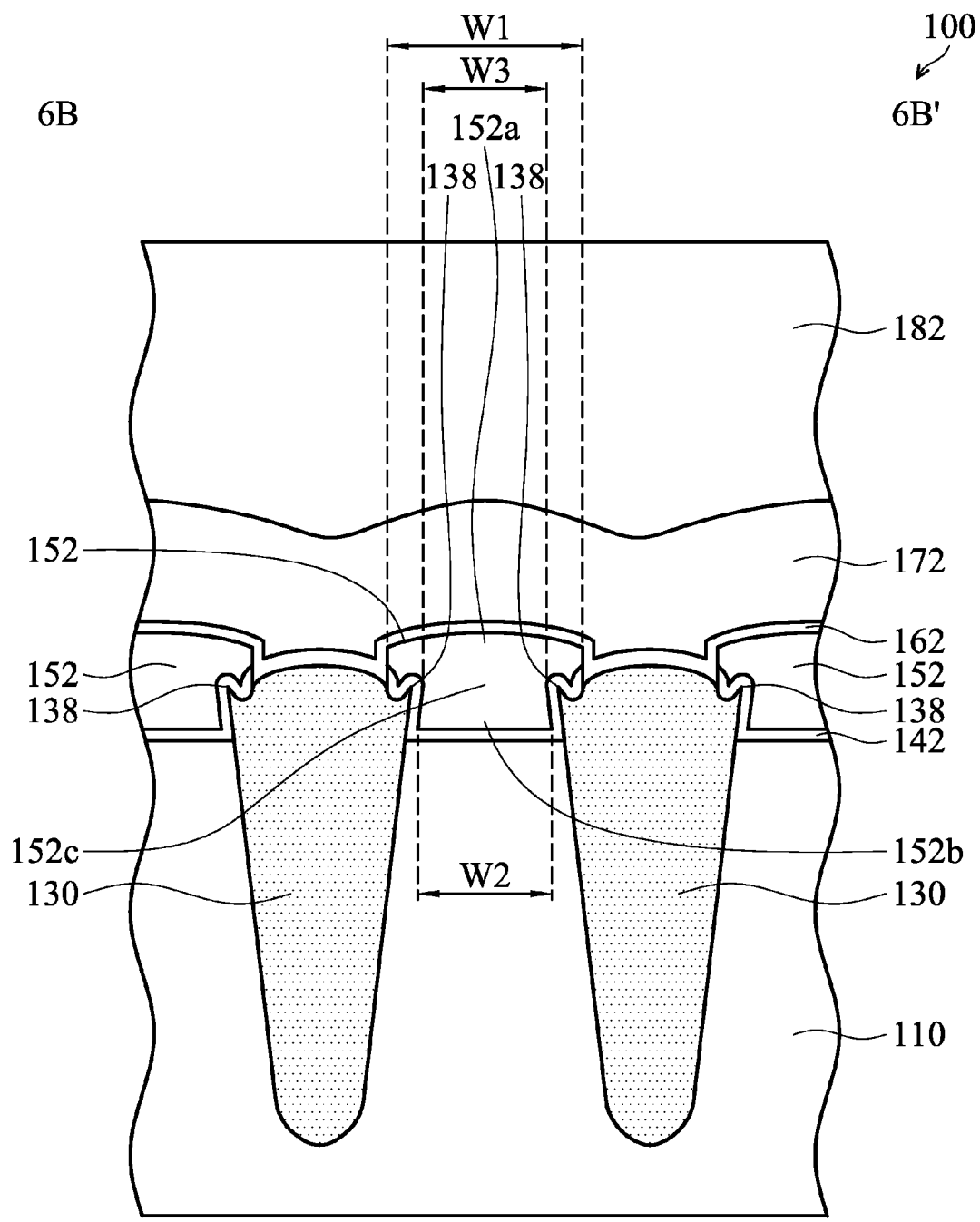
FIG. 6B is a cross-sectional view illustrating the semiconductor device structure along sectional line 6B-6B' in FIG. 6A, in accordance with some embodiments.

FIG. 4K is a cross-sectional view illustrating the semiconductor device structure 100 along sectional line 4K-4K' in FIG. 6A, in accordance with some embodiments. FIG. 6B is a cross-sectional view illustrating the semiconductor device structure 100 along sectional line 6B-6B' in FIG. 6A, in accordance with some embodiments.

As shown in FIGS. 4K, 6A, and 6B, after the step of FIG. 4J, the conductive layer 330 outside of the openings 322 and 324 are removed, in accordance with some embodiments. The removal process includes a chemical mechanical polishing (CMP) process, in accordance with some embodiments. After the removal process, the conductive layer 330 remaining in the opening 322 forms a contact structure 332, in accordance with some embodiments. The contact structure 332 is electrically connected to the metal silicide layer 291, in accordance with some embodiments.

The conductive layer 330 remaining in the opening 324 forms a contact structure 334, in accordance with some embodiments. The contact structure 334 is electrically connected to the metal silicide layer 295, in accordance with some embodiments. In this step, a semiconductor device structure 100 is substantially formed, in accordance with some embodiments.

As shown in FIG. 6B, the floating gate 152 has the upper portion 152a, a lower portion 152b, and a neck portion 152c, in accordance with some embodiments. The upper portion 152a is over the lower portion 152b, in accordance with some embodiments. The neck portion 152c is between the lower portion 152b and the upper portion 152a, in accordance with some embodiments. The neck portion 152c is between the edges 138, in accordance with some embodiments. In some embodiments, the width W1 of the upper portion 152a is greater than the width W2 of the lower portion 152b. In some embodiments, the width W2 is greater than the width W3 of the neck portion 152c.

In some embodiments, a ratio (W1/W2) of the width W1 to the width W2 ranges from about 1.05 to about 1.4. In some embodiments, a ratio (W1/W3) of the width W1 to the width W3 ranges from about 1.25 to about 2. In some embodiments, the width W1 ranges from about 420 Å to about 900 Å.

In accordance with some embodiments, semiconductor device structures and methods for forming the same are provided. The methods (for forming the semiconductor device structure) form a floating gate extending onto (or overlapping) upper surfaces of isolation structures. Therefore, the width of an upper portion of the floating gate is increased. As a result, the overlapping area between the floating gate and a control gate formed thereover is enlarged as well. Therefore, the coupling ratio of the control gate to the floating gate is improved, which improves the electrical property of the semiconductor device structure with the floating gate.

In accordance with some embodiments, a semiconductor device structure is provided. The semiconductor device structure includes a substrate. The semiconductor device structure also includes a first isolation structure partially embedded in the substrate. The first isolation structure has a first upper surface with a first recess. The semiconductor device structure further includes a second isolation structure partially embedded in the substrate. The semiconductor device structure includes a first gate over the substrate and between the first isolation structure and the second isolation structure. The first gate extends onto the first upper surface to cover the first recess. The semiconductor device structure also includes a second gate over the first gate.

In accordance with some embodiments, a semiconductor device structure is provided. The semiconductor device structure includes a substrate. The semiconductor device structure also includes a first isolation structure partially embedded in the substrate. The first isolation structure has a first upper surface. The semiconductor device structure further includes a second isolation structure partially embedded in the substrate. The second isolation structure has a second upper surface. The semiconductor device structure includes a first gate over the substrate and between the first isolation structure and the second isolation structure. The first gate extends onto the first upper surface and the second upper surface. The first gate has a lower portion and an upper portion over the lower portion. A first width of the upper portion is greater than a second width of the lower portion. The semiconductor device structure includes a second gate over the first gate.

In accordance with some embodiments, a method for forming a semiconductor device structure is provided. The method includes forming a mask layer over a substrate. The method also includes forming a first isolation structure and a second isolation structure passing through the mask layer and penetrating into the substrate. The method further includes thinning the mask layer to expose a first portion of the first isolation structure and a second portion of the second isolation structure. In addition, the method includes partially removing the first portion and the second portion to increase a distance between the first portion and the second portion. The method includes removing the thinned mask layer. The method also includes forming a first gate over the substrate and between the first isolation structure and the second isolation structure. The first gate partially covers a first upper surface of the first isolation structure. The method further includes forming a dielectric layer over the first gate. In addition, the method includes forming a second gate over the dielectric layer and above the first gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a first isolation structure partially embedded in the substrate, wherein the first isolation structure has a first upper surface with a first recess extending below a top of the first isolation structure and a first protruding edge extending away from the substrate, and the first recess is between the top of the first isolation structure and the first protruding edge;
   a second isolation structure partially embedded in the substrate;
   a first gate over the substrate and between the first isolation structure and the second isolation structure, wherein the first gate extends onto the first upper surface and above the top of the first isolation structure to cover the first recess and the first protruding edge, so that the first gate has a lower portion, an upper portion over the lower portion, and a neck portion between the lower portion and the upper portion, and wherein a first width of the lower portion is greater than a second width of the neck portion; and
   a second gate over the first gate.

2. The semiconductor device structure as claimed in claim 1, wherein the second isolation structure has a second upper surface with a second recess, and the first gate further extends onto the second upper surface to cover the second recess.

3. The semiconductor device structure as claimed in claim 1, wherein the first recess is adjacent to the first protruding edge of the first isolation structure, and the first protruding edge extends above a bottom of the first recess.

4. The semiconductor device structure as claimed in claim 1, wherein the first gate has a third width greater than a distance between the first isolation structure and the second isolation structure.

5. The semiconductor device structure as claimed in claim 1, further comprising:
   a dielectric layer between the first gate and the second gate, wherein the dielectric layer has a bottom surface in contact with the top of the first isolation structure, and the bottom surface of the dielectric layer is lower than a top of the first gate that extends onto the first upper surface.

6. The semiconductor device structure as claimed in claim 1, wherein the second gate covers a third upper surface and a sidewall of the first gate.

7. The semiconductor device structure as claimed in claim 1, wherein the first gate is in a T-like shape.

8. The semiconductor device structure as claimed in claim 1, wherein the second isolation structure has a second protruding edge extending away from the substrate, and the first gate covers the second protruding edge.

9. The semiconductor device structure as claimed in claim 1, wherein a top of the upper portion of the first gate is above the top of the first isolation structure, and a fourth width of the upper portion is greater than the first width of the lower portion.

10. The semiconductor device structure as claimed in claim 9, wherein a ratio of the fourth width of the upper portion to the first width of the lower portion ranges from about 1.05 to about 1.4.

11. The semiconductor device structure as claimed in claim 9, wherein a ratio of the fourth width of the upper portion to the second width of the neck portion ranges from about 1.25 to about 2.

12. The semiconductor device structure as claimed in claim 1, wherein the first gate has a third protruding edge toward the substrate, and the third protruding edge of the first gate is over the first protruding edge of the first isolation structure.

13. A semiconductor device structure, comprising:
   a substrate;
   a first isolation structure partially embedded in the substrate, wherein the first isolation structure has a first upper surface with a first recess extending below a top of the first isolation structure and a first protruding edge extending away from the substrate, and wherein the first protruding edge extends above a bottom of the first recess, and the first recess is between the top of the first isolation structure and the first protruding edge;
   a second isolation structure partially embedded in the substrate, wherein the second isolation structure has a second upper surface;
   a first gate over the substrate and between the first isolation structure and the second isolation structure, wherein the first gate extends onto the first upper surface and above a top of the first isolation structure and extends onto the second upper surface, the first gate has a lower portion and an upper portion over the lower portion, and a first width of the upper portion is greater than a second width of the lower portion; and
   a second gate over the first gate.

14. The semiconductor device structure as claimed in claim 13, wherein the first protruding edge extends into the first gate, and the second isolation structure has a second protruding edge extending away from the substrate and into the first gate.

15. The semiconductor device structure as claimed in claim 14, wherein the first gate has a third protruding edge and a fourth protruding edge extending toward the substrate.

16. The semiconductor device structure as claimed in claim 15, wherein the third protruding edge is over the first protruding edge, and the fourth protruding edge is over the second protruding edge.

17. The semiconductor device structure as claimed in claim 13, wherein the first gate is in a T-like shape.

18. A semiconductor device structure, comprising:
   a substrate;
   a first isolation structure partially embedded in the substrate, wherein the first isolation structure has a first upper surface;
   a second isolation structure partially embedded in the substrate, wherein the second isolation structure has a second upper surface;
   a first gate over the substrate and between the first isolation structure and the second isolation structure, wherein the first gate extends onto the first upper surface and the second upper surface, the first gate has a lower portion and an upper portion over the lower portion, and a first width of the upper portion is greater than a second width of the lower portion; and
   a second gate over the first gate,
   wherein the first isolation structure has a first protruding edge extending away from the substrate and into the first gate, and the second isolation structure has a second protruding edge extending away from the substrate and into the first gate, and
   wherein the first gate further has a neck portion between the lower portion and the upper portion, and the second width of the lower portion is greater than a third width of the neck portion.

19. The semiconductor device structure as claimed in claim 18, wherein the neck portion is between the first protruding edge and the second protruding edge.

20. The semiconductor device structure as claimed in claim 18, wherein the first gate has a third protruding edge and a fourth protruding edge extending toward the substrate, and wherein the third protruding edge is over the first protruding edge, and the fourth protruding edge is over the second protruding edge.

* * * * *